United States Patent
Roose et al.

(10) Patent No.: US 10,635,844 B1
(45) Date of Patent: Apr. 28, 2020

(54) METHODS AND SYSTEMS FOR SIMULATING VISION SENSOR DETECTION AT MEDIUM FIDELITY

(71) Applicant: The MathWorks, Inc., Natick, MA (US)

(72) Inventors: Trevor Roose, Randolph, MA (US); Vincent M. Pellissier, Holliston, MA (US); Witold R. Jachimczyk, Sutton, MA (US); Zheng Wu, Newton, MA (US); Elad Kivelevitch, Jamaica Plain, MA (US); Gregory E. Dionne, Winchester, MA (US)

(73) Assignee: The MathWorks, Inc., Natick, MA (US)

( * ) Notice: Subject to any disclaimer, the term of this patent is extended or adjusted under 35 U.S.C. 154(b) by 139 days.

(21) Appl. No.: 15/906,722

(22) Filed: Feb. 27, 2018

(51) Int. Cl.
*G06F 30/20* (2020.01)
*G06T 7/73* (2017.01)
(Continued)

(52) U.S. Cl.
CPC .............. *G06F 30/20* (2020.01); *G06T 7/20* (2013.01); *G06T 7/75* (2017.01); *B60W 30/08* (2013.01);
(Continued)

(58) Field of Classification Search
CPC ....... G06F 17/5009; G06F 30/20; G06T 7/20; G06T 7/75; G06T 2207/10004; G06T 2207/30261; B60W 30/08; B60W 50/04
See application file for complete search history.

(56) References Cited

U.S. PATENT DOCUMENTS

| 8,164,628 B2 | 4/2012 | Stein et al. |
| 2015/0154461 A1* | 6/2015 | Kitaura ............. G06K 9/00845 348/148 |

(Continued)

OTHER PUBLICATIONS

Mussabayev et al. "Colour-Based Object Detection, Inverse Kinematics Algorithms and Pinhole Camera Model for Controlling Robotic Arm Movement System." Twelve International Conference on Electronics Computer and Computation, Sep. 27, 2015, 9 pages (Year: 2015).*
Bai, Jie, et al., "Simulation and Testing of Advanced Driver Assistance System Based on Environmental Model of Pedestrian-Vehicle-Road," Jun. 2014, pp. 1-10.
(Continued)

*Primary Examiner* — Jon Chang
(74) *Attorney, Agent, or Firm* — Cesari and McKenna, LLP; Michael R. Reinemann

(57) ABSTRACT

Synthetic object detection data is generated for a modeled sensor, such as a camera. Scenario data specifying objects, such as vehicles, sensor intrinsics, such as focal length, principal point, and image size, and sensor extrinsics, such location and orientation in the scenario of the sensor, may be received. An object detector model may detect a given object in the scenario if it lies within the sensor's field of view, is large enough, and is not occluded. Two dimensional (2D) image plane position and velocity measurements may be generated. A measurement noise model may add noise to the measurements. Position, velocity, and measurement noise may be mapped into a three dimensional (3D) world coordinate system. An object detection list that includes time of detection, detected position and velocity, measurement accuracy, and an object classification for detected objects may be output.

49 Claims, 22 Drawing Sheets

(51) Int. Cl.
*B60W 30/08* (2012.01)
*G06T 7/20* (2017.01)
*B60W 50/04* (2006.01)

(52) U.S. Cl.
CPC .... *B60W 50/04* (2013.01); *G06T 2207/10004* (2013.01); *G06T 2207/30261* (2013.01)

(56) References Cited

U.S. PATENT DOCUMENTS

| | | | |
|---|---|---|---|
| 2015/0339533 A1* | 11/2015 | Liu | G06K 9/00805 382/104 |
| 2017/0329333 A1* | 11/2017 | Passot | A47L 11/4011 |
| 2018/0203445 A1* | 7/2018 | Micks | G06F 17/5095 |

OTHER PUBLICATIONS

Kuo, Ying-Che, et al., "Vision-Based Vehicle Detection for a Driver Assistance System," Elsevier Ltd., Computers and Mathematics with Application, vol. 61, Issue 8, Apr. 2011, pp. 2096-2100.

Leneman, Ir. F. J.W., et al., "PreScan, Testing and Developing Active Safety Applications Through Simulation," 2008, pp. 1-8.

Schubert, Robin, et al., "Evaluating Automated Vehicle Systems Using Probabilistic Sensor Simulations," 10th ITS European Congress, Helsinki, Finland, Jun. 16-19, 2014, pp. 1-5.

Ziyi, Peng, et al., "Virtual Experimental Environment Design of Camera-Sensor-Based Lane Detection System," Jun. 2015, pp. 1-7.

"PreScan Help: PreScan R7.0.0," PreScan, A Simulation & Verification Environment for Intelligent Vehicle Systems, TASS BV and TNO, Dec. 19, 2014, pp. 1-1137.

* cited by examiner

|  | ID:0 (Unknown) | ID:1 (Car) | ID:2 (Truck) | ID:3 (Van) |
|---|---|---|---|---|
| ID:1 (Car) *1006* | 1% | 90% | 5% | 4% |
| ID:2 (Truck) *1007* | 5% | 5% | 80% | 10% |
| ID:3 (Van) *1008* | 2% | 2% | 3% | 95% |
| ID:4 (Pedestrian) *1009* | 50% | 5% | 30% | 15% |

True Class IDs / Detector's Known Class IDs

METHODS AND SYSTEMS FOR SIMULATING VISION SENSOR DETECTION AT MEDIUM FIDELITY

BRIEF DESCRIPTION OF THE DRAWINGS

The description below refers to the accompanying drawings, of which:

FIG. 10 is a schematic illustration of an example confusion matrix 1000 in accordance with one or more embodiments;

DETAILED DESCRIPTION OF ILLUSTRATIVE EMBODIMENTS

Many vehicles, e.g., cars and trucks now include one or more Advanced Driver Assistance Systems (ADAS) and/or active safety systems. These systems monitor the car or truck's environment and help with braking and steering tasks. These systems may also provide warnings or alerts of unsafe conditions. Exemplary ADAS and active safety systems include Automatic Emergency Braking (AEB) in which a vehicle's brakes are applied automatically to prevent a collision or reduce collision speed; Forward-Collision Warning (FCW) in which visual and/or audible warnings are issued to alert a driver to a potential collision: Blind-Spot Warning (BSW) in which visual and/or audible warnings are issued to the driver indicating a vehicle in blind spot; Rear cross-traffic warning in which visual, audible, or haptic notifications are issued to a driver of an object or vehicle that is out of the rear camera's range, but could be moving into it; Rear Automatic Emergency Braking (Rear AEB) in which a vehicle's brakes are automatically applied to prevent backing into an object behind the vehicle; Lane-Departure Warning (LDW) in which visual, audible, or haptic warnings are issued to alert the driver when the vehicle crosses lane markings; Lane-Keeping Assist (LKA) in which automatic corrective steering input or braking is provided to keep a vehicle within lane markings; Lane-centering assist in which continuous active steering is applied to keep a vehicle within lanes; and Adaptive Cruise Control (ACC) in which a vehicle is automatically kept a constant distance from the vehicle ahead. In addition to ADAS and active safety systems, autonomous vehicles are being designed, built, and tested. Many of these safety features as well as autonomous vehicle systems rely on image data generated by one or more vehicle mounted cameras.

Figure 1:
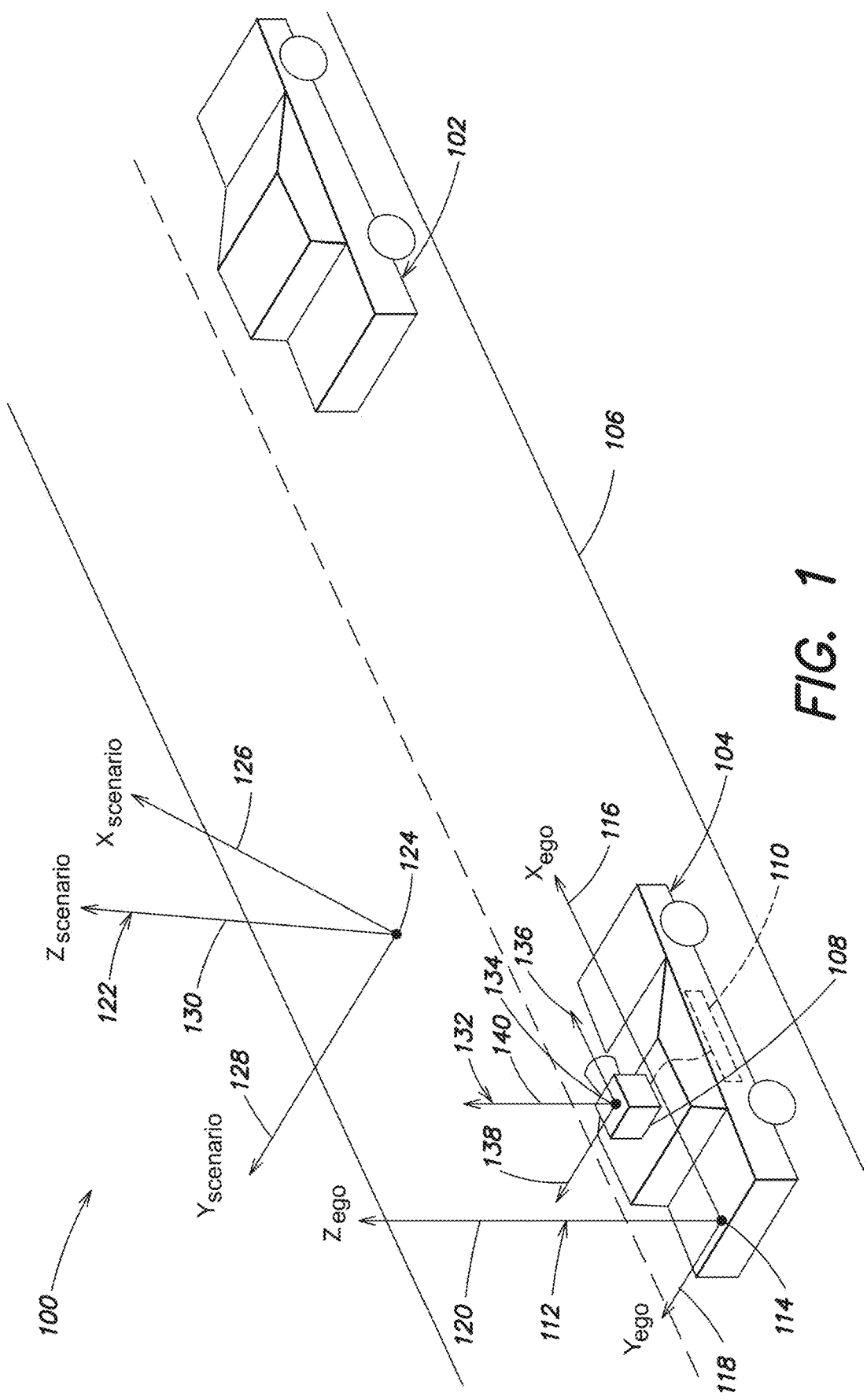
FIG. 1 is a schematic illustration of an example environment representing a road scene in accordance with one or more embodiments.

FIG. 1 is a schematic illustration of an example environment 100 representing a road scene. The environment 100 includes a leading car 102 and a following car 104 traveling along a road 106. The following car 104 has a forward mounted camera 108, and may be referred to as the ego vehicle. The camera 108 may be a visible light (VIS) video camera. The camera 108 may use an Active-Pixel Sensor (APS), Complementary Metal-Oxide Semiconductor (CMOS) image sensor, and/or a Charge-Coupled Device (CCD) image sensor, and may have a resolution for example of 640×480×3. The output of the camera 108 may be coupled to one or more controllers indicated at 110. The controller 110 may implement one or more ADAS, active safety, and/or autonomous vehicle systems, and be connected to one or more of the car's systems, such as the engine, throttle, brakes, or warning systems of the following car 104 and/or controllers therefor. The controller 110 may process image data from the camera 108 and detect objects, such as the leading car 102, within the image data. Detection of the leading car 102 may be used by the ego vehicle's controller 110.

A coordinate system or frame 112 referred to as the ego vehicle coordinate system or frame may be established at the following car 104. The ego vehicle coordinate system 112 may include an origin 114, an x-axis ($x_{ego}$) 116, a y-axis ($y_{ego}$) 118, and a z-axis ($z_{ego}$) 120. The $x_{ego}$ axis 116 may point forward, the $y_{ego}$ axis 118 may point left, and the $z_{ego}$ axis 120 may be the cross of vectors represented by the $x_{ego}$ axis 116 and the $y_{ego}$ axis 118. In some embodiments, the origin 114 of the ego vehicle coordinate frame 112 may be located directly below the focal point of the camera 108. In addition, another coordinate system or frame 122, referred to as the world or scenario coordinate system or frame, may be established in the environment 100. The scenario coordinate system 122 may include an origin 124, an x-axis ($x_{scenario}$) 126, a y-axis ($y_{scenario}$) 128, and a z-axis ($z_{scenario}$) 130. In an embodiment, the $x_{scenario}$ axis 126 may point north, the $y_{scenario}$ axis 128 may point west, and the $z_{scenario}$ axis 130 may point up. Yet another coordinate system or frame 132 referred to as the camera coordinate system or frame may be established at the camera 108. The camera coordinate system 132 may include an origin 134, an x-axis ($x_{camera}$) 136, a y-axis ($y_{camera}$) 138, and a z-axis ($z_{camera}$) 140. The coordinate frames 112, 122, and/or 132 may be defined and established by a user for evaluating relationships among objects in the environment 100. One or more of the coordinate frames 112, 122, and/or 132 may match agreed upon conventions.

FIG. 1 is meant for illustrative purposes only. For example, the camera 108 may be mounted inside the car's cabin or in other locations.

To design, test and/or verify a controller for an ADAS, active safety and/or autonomous vehicle system, a model of the controller 110 may be created in a model-based design environment, such as the MATLAB® development environment and/or the Simulink® modeling environment both from The MathWorks, Inc. of Natick, Mass. Real world image data may be obtained, for example by capturing the output of a camera as a car is driven in an environment. The real world image data may be stored in the memory of a data processing device, and accessed by a model of a controller running in the MATLAB and/or Simulink environments. In some cases, the real world image data may be pre-processed to generate object detections, and the object detections may be accessed by the model. The controller model may process the sample data, and a user, e.g., a developer, may evaluate the model's outputs, and refine the controller model, as needed. This process may involve running various iterations of the controller model hundreds or even thousands of times to design a controller model having the desired behavior. When the developer is satisfied with the behavior of the controller model, code may be generated for the controller model. The code may be compiled for execution outside of the model-based design environment, and deployed, e.g., loaded, onto target hardware for execution. The target hardware may be one or more embedded platforms installed in the following car 104 that implement the controller 110.

Creating real world image data for use in designing, testing, and/or verifying a controller design can be expensive and time consuming. Also, the portrayal of objects in the real world image data represents only what was captured by the camera, and typically cannot be modified, for example to evaluate variations in the scene. As a result, the usefulness of real world image data in the design, test, and/or verification of a controller design is limited.

In some embodiments, simulated image data or object detection data may be generated for use in designing, testing, and/or verifying controllers. For example, point target models can output simulated object detections. Point target models, however, have several disadvantages. They typically ignore intrinsic parameters of the imaging sensor, e.g., camera. They also model measurement noise only in scenario coordinates. Point target models may also fail to account for occlusion when an object obstructs the sensor's line of sight. Point target models are sometimes referred to as low fidelity camera models. In another example, computer gaming engines can be used to model realistic "camera" images from high definition, three dimensional (3D) scenes. Gaming engine sensor models can accurately model the performance of a real sensor. However, significant time is usually required to create a 3D computer graphic scene. In addition, generating simulated vision or detection data using gaming engine sensor models is computationally expensive. Camera models that utilize gaming engines are sometimes referred to as high fidelity camera models.

Briefly, the present disclosure relates to systems and methods for generating simulated object detection data by modeling a vision sensor, such as a monocular camera, and a detection algorithm. Parameters of the vision sensor and the detection algorithm may be adjusted to model different vision sensors and algorithms. The object detection data generated by the systems and methods may include a list of detected objects, e.g., cars, trucks, pedestrians, etc., their positions and velocities in a three dimensional (3D) world coordinate system, a measurement accuracy, or a classification of the objects. The generated object detection data may be used in the design, testing, or verification of controllers, such as ADAS systems, active safety systems, and/or autonomous vehicle systems, among others.

Objects to be detected by the systems and methods may be represented in digital data by simple 3D geometric shapes, such as cuboids. The objects may be assigned ground truth information in the 3D world coordinate system, such as position, orientation, and speed/velocity relative to the vision sensor for which the simulated object detection data is being generated. Objects may also be assigned classifications and identifiers (IDs). Values for extrinsic parameters for the sensor, such as the sensor's location and orientation on an ego vehicle, may be specified. Values for intrinsic parameters for the sensor, such as focal length, principal point, and image size, also may be specified. Values for parameters of the detection algorithm also may be specified. At least some of these values may be adjustable, e.g., by a user of the systems and methods.

The systems and methods may perform a transformation of one or more of the objects from the 3D world coordinate system to a 3D camera coordinate system using the specified extrinsic parameter values. The systems and methods may perform a projective transform from the camera coordinate system to a two dimensional (2D) image, e.g., pixel, coordinates at an image plane of the sensor using the specified intrinsic parameter values. The systems and methods may include an object detector model, which may determine that a given object is detected by the sensor where the given object lies within the sensor's field of view, lies below a horizon, is large enough to be found by the sensor, and is not occluded by other targets to an extent that prevents detection, and a uniform random draw satisfies a detection probability.

For those objects determined to be detectable, the object detector model may generate position and velocity measurements in the 2D image plane. In some embodiments, the object detector model may generate the measurements at a given time epoch, and the measurements may be independent of measurements from another, e.g., earlier, time epoch. The object detector model may also generate a standard deviation for the measurements that is consistent with the standard deviation of position and velocity, as estimated by a Kalman filter, e.g., in steady state conditions. For example, the object detector model may emulate position and velocity variance and cross variance of a Kalman filter.

The systems and methods may include a measurement noise model, which may add noise to the position and velocity measurements, for example based on the uncertainty of the object's position introduced by the width and height of the sensor's pixel. The systems and methods may use a 2D projective transform, such as a homograph, to map the object's position and velocity as well as measurement noise, which may be in the form of pixel noise, from the 2D image plane into the 3D world coordinate system. The systems and methods may also apply a confusion matrix to a detected object's true classification to generate a simulated classification. The systems and methods may output an object detection list. The object detection list may include information for each detected object, such as time of detection, detected position and velocity in the 3D world coordinate frame, measurement accuracy, and a simulated classification.

In some embodiments, the systems and methods of the present disclosure may provide a medium fidelity model of a vision sensor and detection algorithm as compared to a high fidelity system that requires a gaming engine and a low fidelity system that reduces targets to mere points. The systems and methods of the present disclosure may thus provide a more accurate model of a vision sensor and detection algorithm than a point model, but without imposing the high demands on processor and/or memory resources of running a gaming engine. With the systems and methods of the present disclosure, many iterations may be run each evaluating different camera and/or detection algorithm parameters in the same time required for a single run of a high fidelity system.

Object Detection Model

Figure 2:
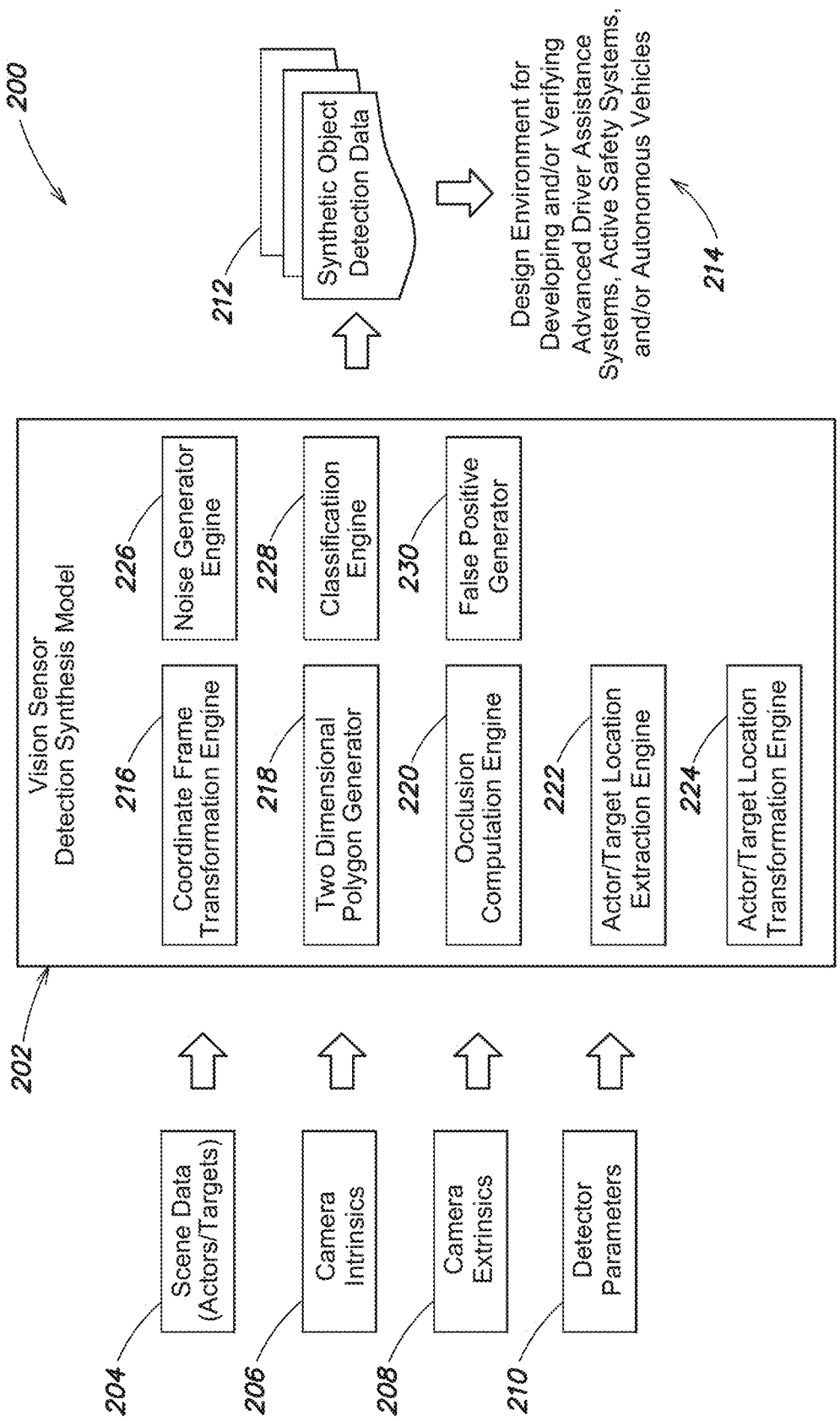
FIG. 2 is a schematic illustration of an example system for generating synthetic object detection data in accordance with one or more embodiments.

FIG. 2 is a schematic illustration of an example system 200 for generating synthetic object detection data in accordance with one or more embodiments. In some embodiments, the system 200 is implemented at least in part in the form of a model 202. The model 202 may receive a number of inputs. For example, the model 202 may receive electronic scene data 204, which may include data representing physical objects, such as vehicles, pedestrians, road signs, etc., or any other physical objects, camera intrinsics 206, camera extrinsics 208, and one or more detector parameters 210. Physical objects intended to be detected may be referred to as actors and/or targets. Camera intrinsics may refer to parameters for linking pixel coordinates of an image point with the corresponding coordinates in a camera reference frame, such as the image plane. Camera extrinsics may refer to the location and orientation of the camera in a world reference frame. Detector parameters may refer to constants or other values used by the detection algorithm and/or object detector model. At least some of the camera intrinsics, camera extrinsics, and detector parameters may be adjustable. For example, a user may choose desired values for at least some of the camera intrinsics, the camera extrinsics, and the detector parameters prior to a given run or execution of the model 202.

The model 202 may generate synthetic object detection data 212. The data 212 may be provided to a design, verification, or testing environment, as indicated at 214, and may be used to design, verify, or test one or more ADAS, active safety, and/or autonomous vehicle systems. The model 202, which may be referred to as a vision sensor detection model, may include a plurality of components. For example, the model 202 may include a coordinate frame transformation engine 216, a two dimensional (2D) polygon generator 218, an occlusion computation engine 220, an actor/target location extraction engine 222, an actor/target location transformation engine 224, a noise generator engine 226, a classification engine 228, and a false positive generator 230.

The coordinate frame transformation engine 216, the 2D polygon generator 218, the occlusion computation engine 220, the actor/target location extraction engine 222, the actor/target location transformation engine 224, the classification engine 228, and the false positive generator 230 may be implemented in the form of one or more object detector models. The noise generator engine 226 may be implemented in the form of a measurement noise model.

In some embodiments, one or more of the coordinate frame transformation engine 216, the 2D polygon generator 218, the occlusion computation engine 220, the actor/target location extraction engine 222, the actor/target location transformation engine 224, the noise generator engine 226, the classification engine 228, or the false positive generator 230 may be implemented through one or more software modules or libraries containing program instructions pertaining to the methods described herein. The software modules or libraries may be stored in persistent memory and/or on non-transitory computer readable media, loaded into volatile memory of a data processing device, and executed by one or more processors. In alternative embodiments, one or more of the coordinate frame transformation engine 216, the 2D polygon generator 218, the occlusion computation engine 220, the actor/target location extraction engine 222, the actor/target location transformation engine 224, the noise generator engine 226, the classification engine 228, or the false positive generator 230 may comprise registers and/or combinational logic configured and arranged to produce sequential logic circuits. Nonetheless, it should be understood that various combinations of software and hardware, including firmware, may be utilized to implement the present disclosure.

One or more of the scene data 204, the camera intrinsics 206, the camera extrinsics 208, and the detector parameters 210 may be implemented through files, libraries, tables, trees, or other data structures.

In some embodiments, the model 202 may be included in or accessible from a program development environment, such as a modeling environment. The program development environment may be used to create or record one or more of the scene data 204, the camera intrinsics 206, the camera extrinsics 208, or the detection parameters 210. The program development environment may also be used to create one or more programs that access or utilize the synthetic object detection data 212. For example, the one or more programs may implement and/or verify an ADAS and/or active safety system.

Scene Data/Camera Intrinsics/Camera Extrinsics/Detection Parameters

Figure 3:
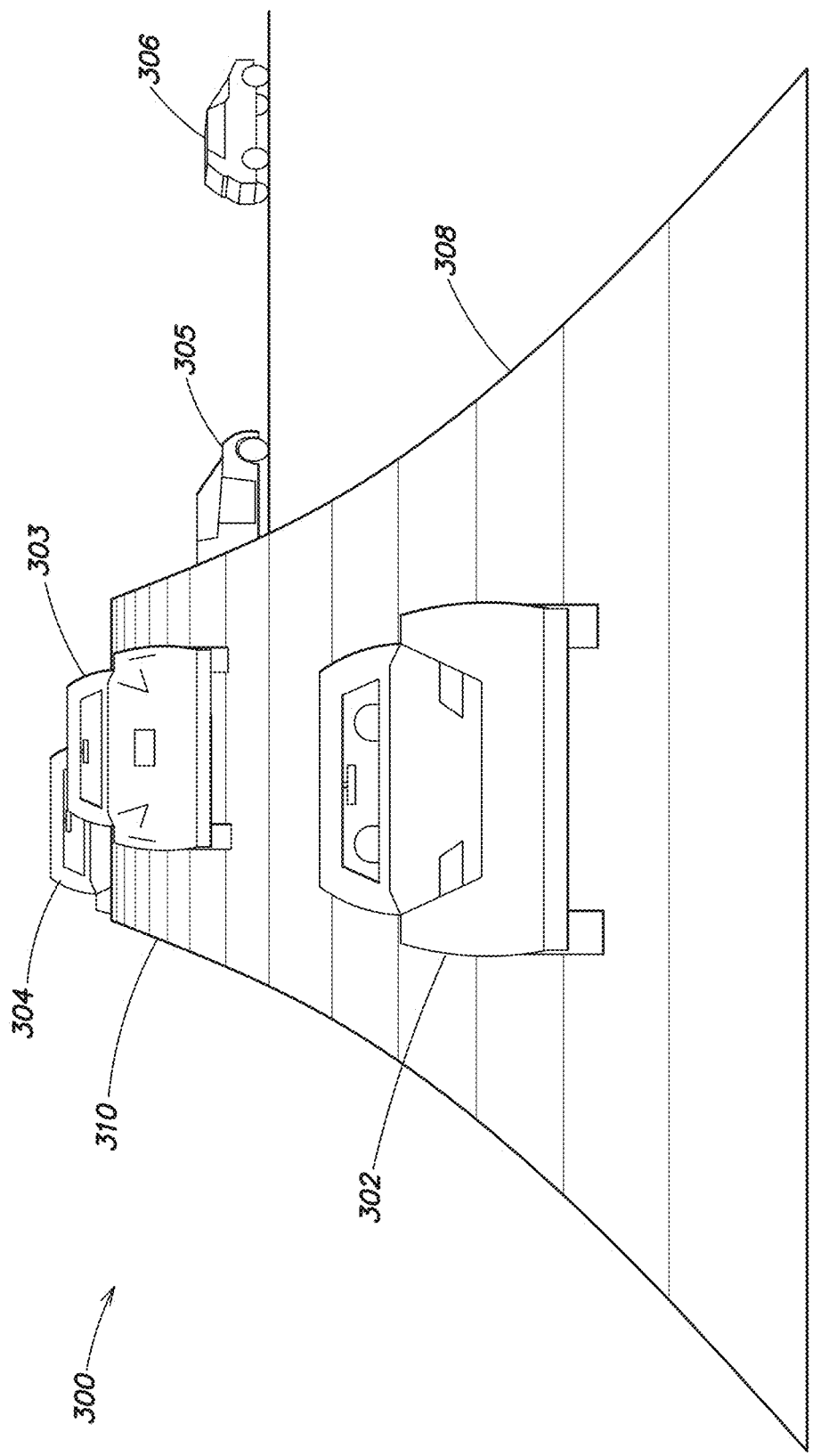
FIG. 3 is a schematic perspective view of an example road scene in accordance with one or more embodiments.
Figure 4:
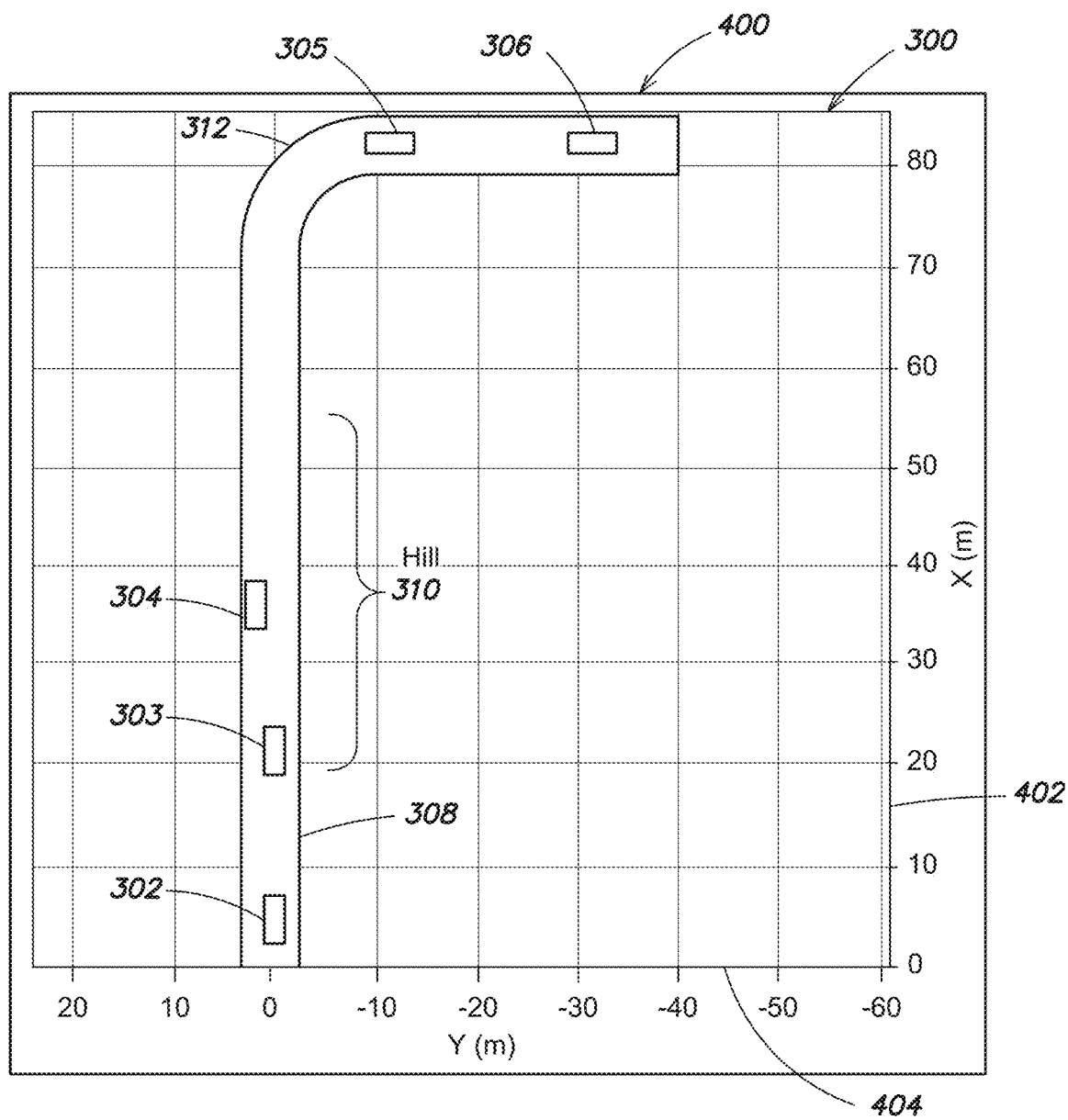
FIG. 4 is a schematic bird's eye view of the example road scene of FIG. 3.

A user may create the scene data 204 utilized by the vision sensor detection synthesis model 202. In some embodiments, the scene data 204 may be a representation of a road scene for which the synthetic object detection data 212 is to be generated. FIG. 3 is a schematic perspective view of an example road scene 300. FIG. 4 is a schematic bird's eye view 400 of the example road scene 300. The road scene 300 includes five cars 302-306 traveling along a road 308 in positions located ahead of an ego vehicle (not depicted) that includes a forward looking camera. The road 308 travels over a hill 310, and includes a right turn portion 312 (FIG. 4) after the hill 310. Cars 302 and 303 are moving up the hill 310, while car 304 has already crested the hill 310. Cars 305 and 306 are on the right turn portion 312. As shown in FIG. 3, a bottom portion of car 304 and a rear portion of car 305 are blocked by the hill 310. The bird's eye view 400 includes an $x_{ego}$ axis 402 and a $y_{ego}$ axis 404.

In some embodiments, the scene data 204 may describe the movement of actors or targets in the scene, including an ego vehicle. The scene data 204 may include data, such as pose and profile information, for each physical object, e.g., actor or target, included in the scene. Pose information may indicate the manner in which an actor or target is disposed, e.g., located and oriented, within the scene, and may vary over a time period. Profile information may include physical characteristics, e.g., height, length, width, etc., of the actor or target. The time period may include a plurality of time instants from a start time to an end time. For each time instant of the time period, the actor pose information may include position, velocity, angular velocity, and orientation, e.g., yaw, pitch, and roll. Position, velocity, angular velocity, and orientation may be specified relative to the ego coordinate system 112. For example, position may be specified in terms of x, y, and z coordinates, velocity may be specified in meters per second (m/s), and orientation may be specified in terms of pitch angle, yaw angle, and roll angle in degrees. A car traveling the same velocity as the ego vehicle and in the same direction may have a velocity of zero. Nonetheless, in some embodiments, one or more of position, velocity, angular velocity, and orientation may be specified relative to the world or scenario coordinate system 122. The actor profile information may include dimensions, e.g., height, width, and length, center of rotation, classification, and radar cross-section, among other attributes.

Actors or targets, which may represent moveable objects such as vehicles, pedestrians, signs, parking meters, etc., may be represented within the scene data 204 by one or more three-dimensional (3D) geometric shapes. In some embodiments, the shapes may be cuboids having a length, width, and a height. The classification may identify the type of actor, e.g., car, truck, pedestrian, sign, traffic light, guardrail, etc. For example, each actor may have a "ClassID" property assigned to it, which may represent the actor's "true classification". Exemplary ClassIDs may include car, van, truck, pedestrian, parking meter, sign post, etc. In addition, each actor may have a unique "ActorID" assigned to it, e.g., Car_1, Pedestrian_12, etc. As noted, actors or targets may be positioned within a scenario by specifying their respective position (x, y, z coordinates), roll, pitch, yaw, velocity, and angular velocity. As noted, actors or targets may be positioned and oriented about a single point, for example in the center of the bottom face of the respective cuboid. In some embodiments, this point may correspond to middle of a car's vehicle's rear axle. The scene data 204 may also include road information. In an embodiment, road information may be represented using road tiles. That is, a road may be represented by a set of adjoining road tiles, and each road tile may have dimensions and a position relative to the ego coordinate system 112 or the scenario coordinate system 122. Road tiles may have centers, widths, elevations, and banking angles.

It should be understood that other 3D geometric shapes may be used to represent actors or targets besides or in addition to cuboids, such as pyramids, cubes, cylinders, cones, spheres, etc., and/or combinations thereof. In some embodiments, other 3D geometries may be used, for example to represent a vehicle outline more precisely than a cuboid. In some embodiments, the 3D geometric shapes may include curves or sampled points, and the physical objects represented by such curves or sampled points may include lane and road markings. As described, by utilizing 3D geometric shapes, the present disclosure may achieve a medium level of fidelity, as compared to other approaches.

In some embodiments, the motion of an actor or target may be defined by a set of waypoints and speeds. A waypoint may be defined by selecting a road tile center and an offset to the left or right to specify vehicle's lane of travel.

The scene data 204 may be implemented as one or more data structures having fields for the various data elements. The one or more data structures may be stored in memory, such as persistent memory of a data processing device.

In some embodiments, scene data 204 and/or actors or targets may be created using a Computer Aided Design (CAD) tool. Other tools that may be used include the OpenDRIVE road network description tool maintained by VIRES Simulationstechnologie GmbH, Bad Aibling, Germany, the CarMaker virtual test driving tool from IPG Automotive GmbH, Karlsruhe, Germany, and the PreScan physics-based automotive simulation platform from TASS International, Helmond, The Netherlands, among others. In some embodiments, a gaming engine, such as the Unreal Engine gaming engine from Epic Games, Inc. of Cary, N.C., may be used to generate the scene data 204. For example, basic shapes, such as the cuboids, may be exported from scenes created with a gaming engine, as opposed to exporting mesh models and surfaces.

In some embodiments, the scene data 204 may include much less information than scene data created using a 3D gaming engine. For example, instead of using meshes of geometric primitives, such as triangles formed from vertices that provide surface models, and texture maps to realistically represent physical objects, the present disclosure may use simple 3D geometric shapes, such as cuboids, to represent physical objects, and does not include any texture maps. The scene data 204 of the present disclosure may not include any surface models formed from primitives, such as triangles, for actors or targets. The 3D geometric shapes, e.g., the cuboids, moreover, may not specify any color information or surface attributes, such as roughness, for example as is done with surface models used by gaming engines. Nonetheless, cuboids of different sizes may be used to represent differently sized actors or targets, e.g., pedestrians, cars, and trucks. The scene data 204 may also be free of lighting effects, such as day and night, and weather effects, such as rain, snowfall, or fog, which may be included in the scene information of a gaming engine.

Figure 5:
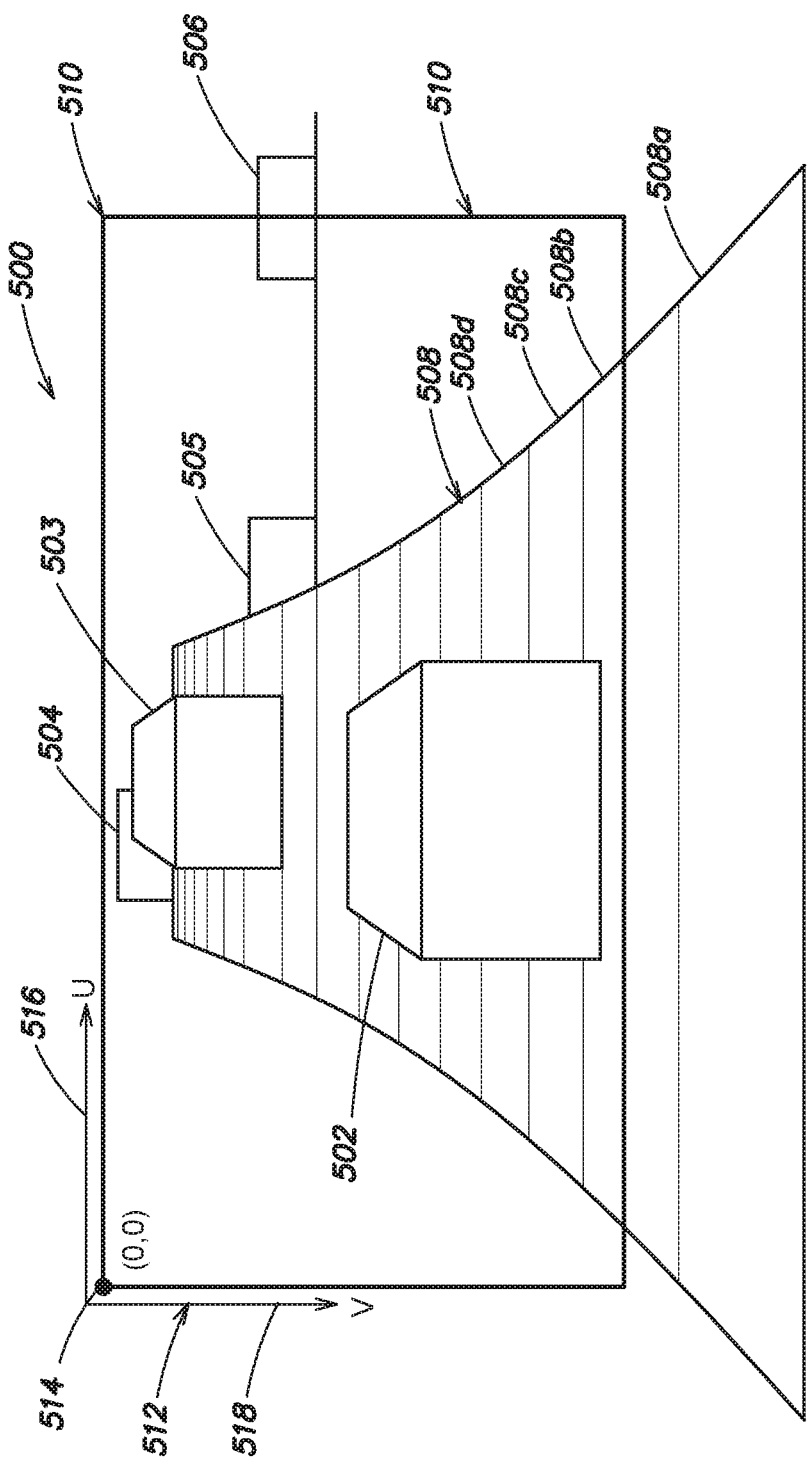
FIG. 5 is a schematic illustration of example scene data for the road scene of FIGS. 3 and 4 in accordance with one or more embodiments.

FIG. 5 is a schematic illustration of scene data 500 for the road scene 300 of FIGS. 3 and 4 for purposes of illustration. The cars 302-306 of the road scene 300 may be represented in the scene data 500 by cuboids 502-506, respectively. Each cuboid may have six faces: front, left, up, back, right, and down. For each cuboid, up to three of the faces may be visible to the forward looking camera on the ego vehicle at any time instant. The road 308 may be represented in the scene data 500 by a plurality of adjacent road tiles, examples of which are designated as reference numbers 508*a-d*, that collectively form road data 508.

A user may also specify values for the camera intrinsics 206, the camera extrinsics 208, and the detector parameters 210 for the camera 108 being modeled. The camera intrinsics 206 may include focal length, principal point, image size, radial distortion, tangential distortion, and skew coefficient or pixel skew. Focal length, principal point, and image size may be specified in pixels. The camera extrinsics 208 may include the mounted position of the camera's principal point in the ego vehicle coordinate frame 112. For example, the mounted position may be the x, y, and z positions of the camera's principal point in the ego vehicle coordinate frame 112. The camera extrinsics 208 may further include pitch, yaw, and roll angles of the camera 108. The pitch angle may be the angle between a nominal horizontal plane of the ego vehicle 104 and the camera's optical axis. The yaw angle may be the angle between the center line of the ego vehicle 104 and the camera's optical axis. The roll angle may be a roll angle of the camera 108 around its optical axis.

In some embodiments, the detector parameters 210 may include one or more of the following parameters:
 the total angular field of view for the camera (FieldOfView), azimuth in degrees and elevation in degrees;
 the maximum range at which an actor or target can be detected by the camera (MaxRange) in meters (m);
 minimum detectable image size of an object (MinObjectImageSize), 1×2 vector [minHeight, minWidth] in pixels, object whose 2D projected size in the camera's image does not exceed both of these values will not be detected by the sensor;

the maximum detectable speed of an actor or object (MaxSpeed), scalar in meters per second (m/s);

the maximum fraction of a target's total area that can be occluded before the target can no longer be detected (MaxAllowedOcclusion), scalar in the interval [0,1], represented as the fraction of the object's total surface area invisible to the camera;

the probability of detecting a target (DetectionProbability), scalar in the interval [0,1], a detectable object is an object which satisfies the minimum detectable object size, maximum range, maximum speed, and maximum allowed occlusion constraints;

the number of false positives per image (FalsePositivesPerImage), scalar greater than or equal to 0 (thereby allowing a user to model conditions without false positives);

the accuracy with which the detector can match a bounding box to a target (BoundingBoxAccuracy), scalar value in pixels;

noise intensity for use in filtering actor position and velocity measurements (ProcessNoiseIntensity), scalar value in meters per second squared (m/s$^2$);

whether to add noise to position and velocity measurements of actors (HasNoise);

the source of the maximum number of detections (MaxNumDetectionsSource);

the maximum number of reported detections (MaxNumDetections);

the coordinate system used to report vision detections (DetectionCoordinates); and set of known ClassIDs of actors.

It should be understood that the foregoing list is for illustrative purposes. In some embodiments different, additional, or fewer parameters may be used, for example one or more of the listed parameters may be omitted and/or not specified. In some embodiments, the vision sensor detection synthesis model 202 may prompt a user to enter values for one or more of the parameters. In some embodiments, default values may be provided by the vision sensor detection synthesis model 202 for one or more of the parameters.

In some embodiments, the camera intrinsics 206, the camera extrinsics 208, and the detector parameters 210 may be created using object oriented programming (OOP) techniques. For example, a user may call an object constructor to construct one or more objects for modeling the camera 108. The object constructor may be provided by a modeling and/or programming environment that may be running the vision sensor detection synthesis model 202. When calling the object constructor, the user may specify values for the parameters of the camera intrinsics 206, the parameters of the camera extrinsics 208, and the parameters of the detector parameters 210, and the object constructor may construct one or more objects having those values as properties. The user may call the object constructor textually using one or more commands having a syntax supported by a modeling environment and/or a programming environment.

Flow Diagrams

FIGS. 6A-6G are partial views of a flow diagram of an example method in accordance with one or more embodiments. The flow diagram of FIGS. 6A-6G is intended for illustrative purposes only. In some embodiments, one or more steps may be omitted, additional steps may be added, or the order of steps may be changed. Furthermore, various groups of the steps illustrated in FIGS. 6A-6G may be separated into multiple, independent flow diagrams.

As described, a user may create scene data 204, including geometric shape data, e.g., cuboids, for actors or targets included in the scene represented by the scene data 204. The scene data 204 may be in digital electronic form and may further include pose and profile information for actors or targets included in a scene as well as road tiles representing roads. The scene data 204 may be provided to the vision sensor detection synthesis model 202, as indicated at step 602. In addition, the model 202 may receive values specified, e.g., by the user, for the camera intrinsics 206 the camera extrinsics 208, and the detector parameters 210, as indicated at steps 604, 606, and 608.

Figure 6A:
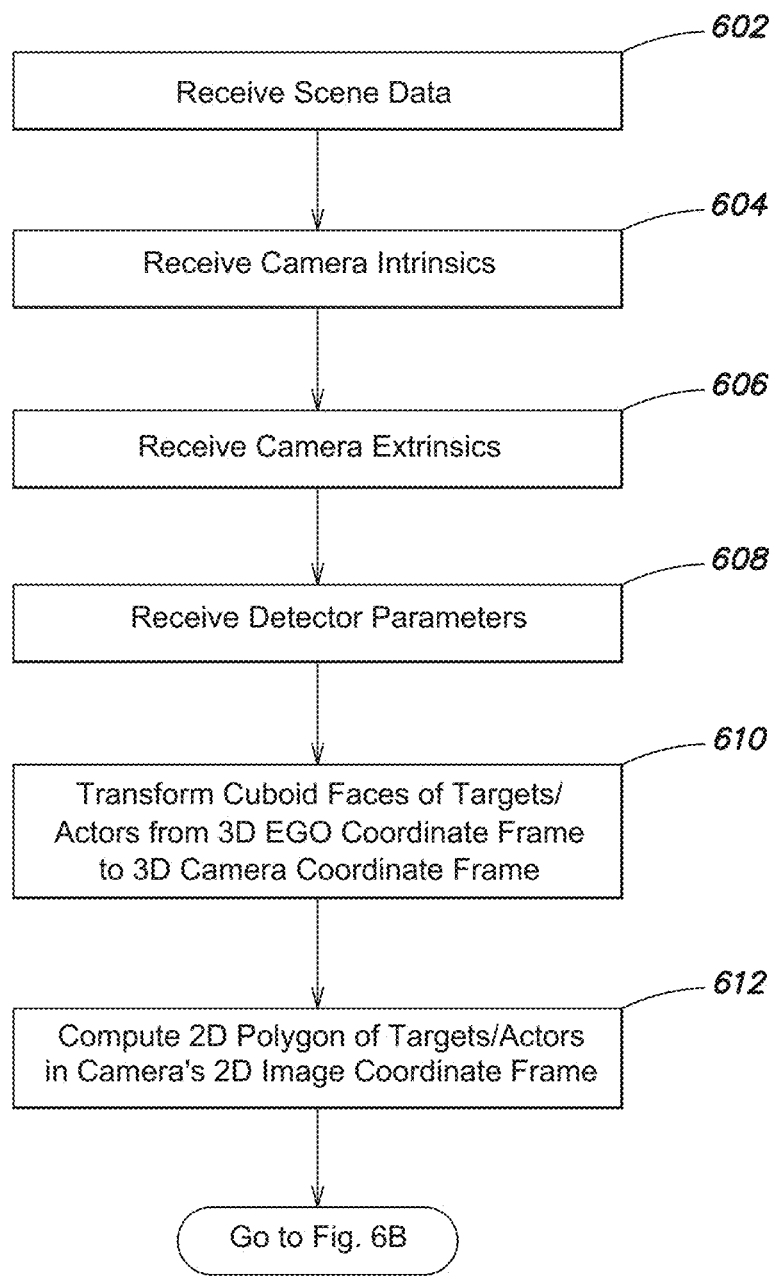
FIGS. 6A-6G are partial views of a flow diagram of a method in accordance with one or more embodiments.
Figure 6B:
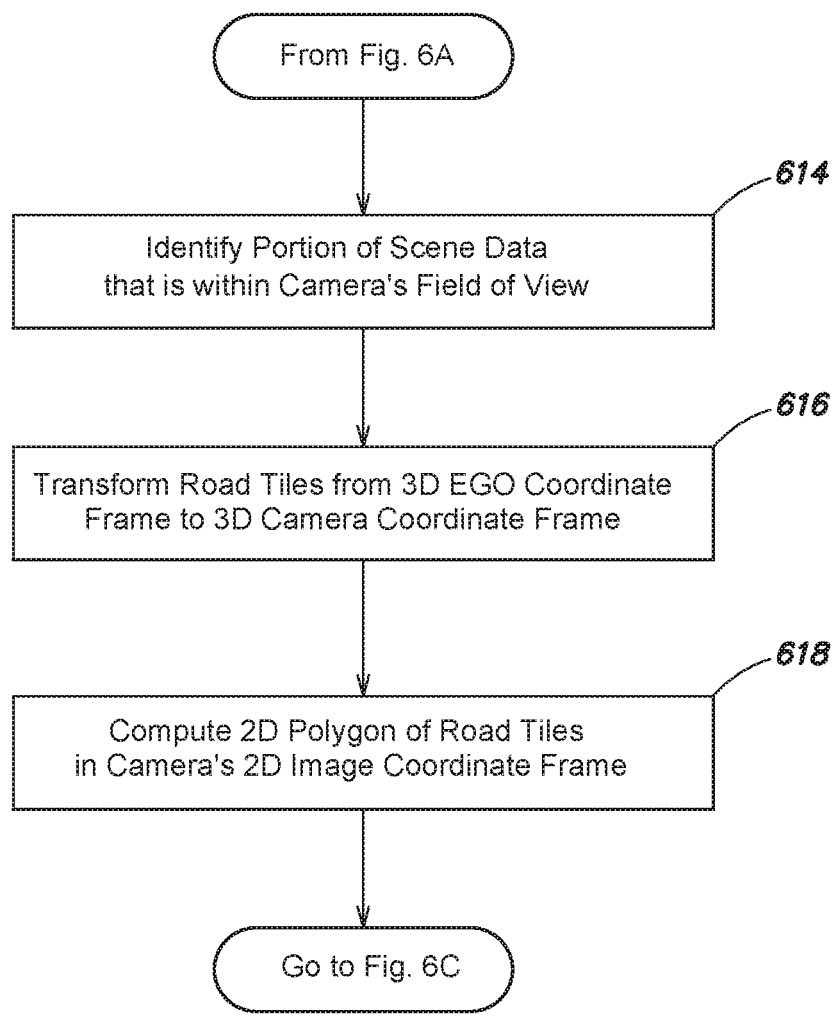

As described, the scene data 204 may include 3D geometric shapes, e.g., cuboids, representing physical objects, e.g., actors or targets. The coordinate frame transformation engine 216 may transform the coordinates of the faces of the cuboids from the 3D ego coordinate frame 112 to the 3D camera coordinate frame 132, as indicated at step 610. If the cuboids were defined in the 2D world coordinate frame 122, they may first be transposed to the 3D ego vehicle coordinate frame 112. For each cuboid face, the 2D polygon generator 218 may compute a 2D polygon in the 2D image coordinate frame of the camera 108, as indicated at step 612. The model 202 may identify a portion of the scene data 204 that is within the field of view of the camera 108, as indicated at step 614 (FIG. 6B). Referring to FIG. 5, a rectangle 510 represents an optical imaging plane of the camera 108. The optical imaging plane may be a two dimensional (2D) image plane of the camera 108. A 2D camera or pixel coordinate frame 512 may be defined with an is origin 514 at the upper left corner of the rectangle 510. The 2D camera coordinate frame 512 may include a horizontal axis 'u' 516 and a vertical axis 'v' 518. Physical objects (or portions thereof) located within the rectangle 510 may be considered within the camera's field of view, and objects (or portions thereof) located outside of the rectangle 510 may be considered outside of the camera's field of view. For example, a 2D camera coordinate frame transformation may provide an image that is not constrained to the size of the camera's optical image plane, e.g., the rectangle 510. The transformation engine 216 may clip the portions of 2D polygons lying outside of the rectangle 510. Only the portions of the 2D polygons contained within the rectangle 510 may remain after they have been clipped. Creation and/or definition of the rectangle 510 (at least logically) relative to the scene data 204, and the clipping of 2D polygons (or portions thereof) located outside of the rectangle 510 may be performed by the vision sensor detection synthesis model 202 based on the specified camera intrinsics and camera extrinsics and by applying one or more transformations between coordinate frames.

The coordinate frame transformation engine 216 may transform the coordinates of the road tiles determined to be within the camera's field of view from the 3D ego vehicle coordinate frame 112 to the 3D camera coordinate frame 132, as indicated at step 616. For the road tiles determined to be within the camera's field of view, the 2D polygon is generator 218 may compute 2D polygons within the camera's 2D image coordinate frame 512, as indicated at step 618.

Figure 6C:
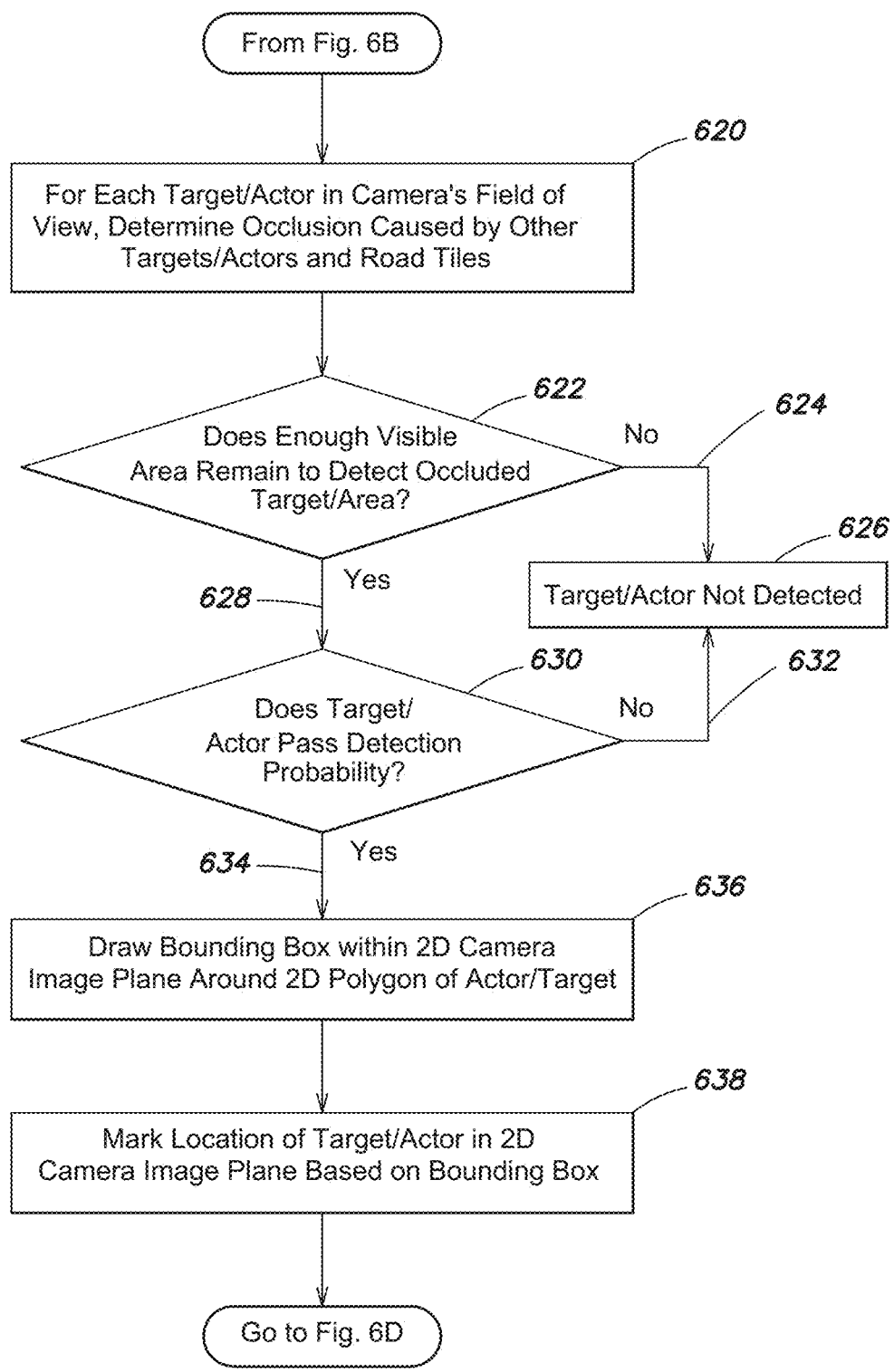

The model 202 may perform a series of operations for each actor or target (or portion thereof) determined to be within the rectangle 510 that represents camera's optical imaging plane. For example, for a given actor, the occlusion computation engine 220 may determine the occlusion of the given actor caused by other actors or targets or by road tiles, as indicated at step 620 (FIG. 6C). The occlusion computation engine 220 may determine whether enough visible area of the given actor remains after taking account of occlusion for the camera to detect the given actor, as indicated at decision step 622. This determination may be a function of the MaxAllowedOcclusion parameter, whose value may have been user specified. If not, the given actor is deemed not detected by the camera 108, as indicated by No arrow 624 leading to step 626.

Figure 7:
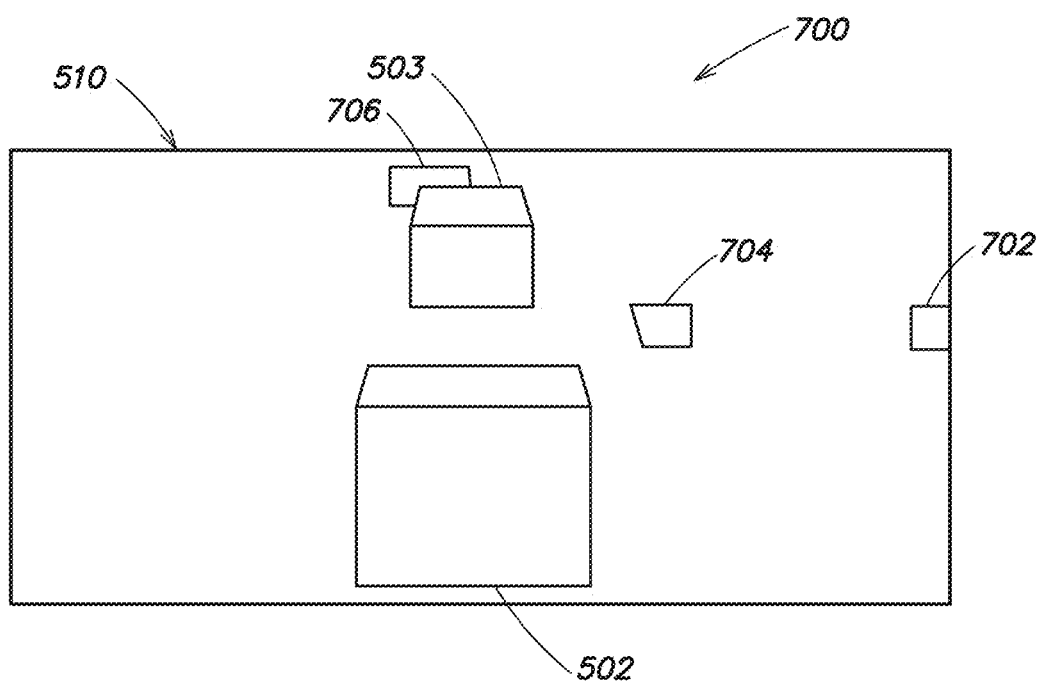
FIG. 7 is a schematic illustration of example scene data based on the geometric shape representations of FIG. 5 in accordance with one or more embodiments.

FIG. 7 is a schematic illustration of example scene data 700 following the removal of actors or targets (or portions thereof) outside of the camera's field of view and following occlusion computations. As illustrated, only a portion 702 of the cuboid 506 (FIG. 5) remains within the camera's optical imaging plane as represented by the rectangle 510. Also, only a portion 704 of the cuboid 505 remains visible. The other portion of the cuboid 505 is occluded by one or more of the road tiles representing the hill 310. Similarly, only a portion 706 of the cuboid 504 remains visible. Other portions of the cuboid 504 are occluded by the cuboid 503 and one or more of the road tiles representing the hill 310. Suppose the area of the remaining portion 704 of the cuboid 505 is too small to be detected. In this case, the cuboid 505 which represents the vehicle 305 is not detected. Suppose the area of the remaining portion 706 of the cuboid 504, however, is large enough to be detected. Then, the cuboid 504 which represents the vehicle 504 may be detected.

Returning to FIG. 6C, if enough of the given actor remains visible to be detected, the model 202 may determine whether the given actor passes a detection probability test, as indicated by Yes arrow 628 leading to decision step 630. If not, the given actor is deemed not detected, as indicated by No arrow 632 leading to step 626. The detection probability test may be a function of the DetectionProbability parameter. This parameter may be specified or adjusted, e.g., by a user, or may be set to a default value. For example, a user may specify a particular value for the DetectionProbability parameter to simulate environmental conditions that may impact detection, such as the existence of rain, snowfall, fog, etc., even though the scene data 204 itself may not include such effects. Values for the DetectionProbability parameter may be determined empirically, for example from using sample hardware in such conditions. The detection probability test may be a draw of a uniform random variable that returns a value on the closed interval [0, 1]. If the returned, random value is less than or equal to the user specified detection probability, then a detection may be generated. Otherwise, i.e., if the returned, random value is greater than the user specified detection probability, a detection may not be generated. For example, if a user selects a detection probability of 90%, and the random draw returns the value 0.5, then a detection is generated, as 0.5≤0.9 is true. If the random draw returned the value 0.95, then no detection may be generated, as 0.95≤0.9 is false. The random draw may be performed for each actor that reaches the detection probability test.

If the given target passes the detection probability test, the actor/target location extraction engine 222 may draw a bounding box around the 2D polygon for the given actor within the 2D camera image plane, as indicated by Yes arrow 634 leading to step 636. The actor/target location extraction engine 222 may mark the location of the given actor in the 2D camera image plane based on the bounding box, as indicated at step 638.

Figure 8:
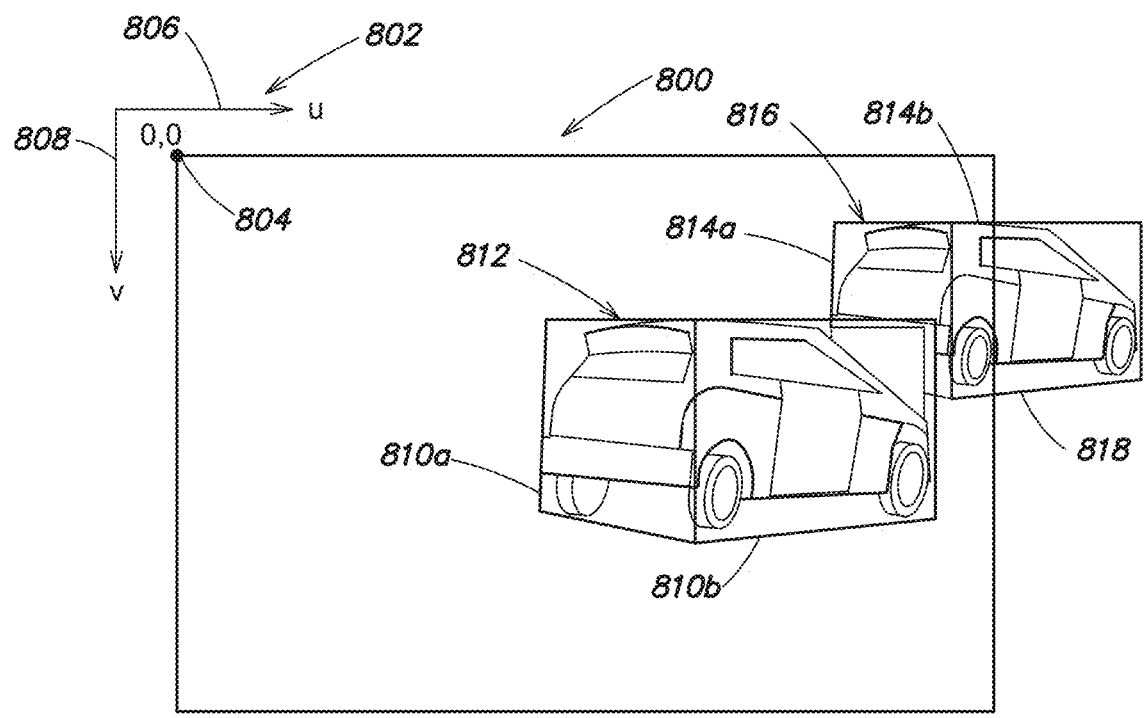
FIG. 8 is a schematic illustration of an example two dimensional (2D) sensor image plane in accordance with one or more embodiments.

FIG. 8 is a schematic illustration of an example 2D pixel image plane 800 for the camera being modeled. The 2D image plane 800 includes a pixel coordinate frame 802 having an origin 804, a horizontal axis 'u' 806, and a vertical axis 'v' 808. Note, the axes 806 and 808 are spaced from the edges of the frame 802 for ease of viewing within the figure. Within the image plane 800 are two 2D polygons 810a and 810b for one target 812 representing a car, and two 2D polygons 814a and 814b for another target 816 representing another car. A portion of the target 816 is occluded by the target 812. In addition, a portion of the target 816 indicated at 818 is outside of the image plane 800. It should be understood that the photographic images of cars appearing in the 2D polygons in FIG. 8 is for illustrative purposes only, and is being provided merely as a visual aid to assist in understanding the present disclosure. No such photographic images need be created and/or included.

Figure 9:
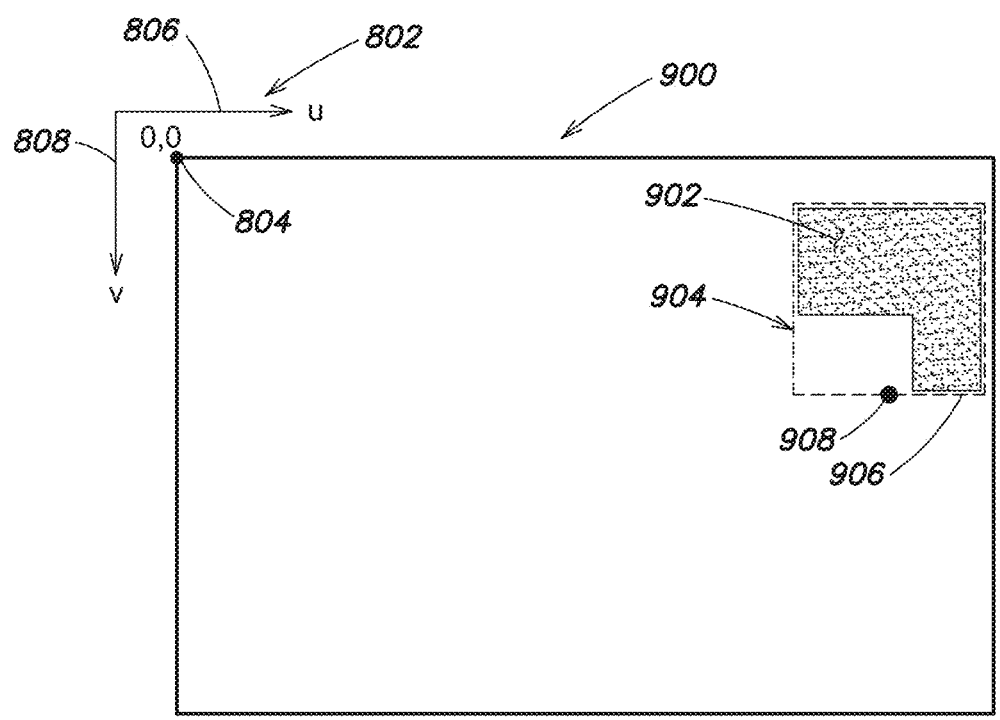
FIG. 9 is a schematic illustration of an example 2D sensor image plane in accordance with one or more embodiments.

FIG. 9 is a schematic illustration of an example 2D pixel image plane 900 of the camera being modeled. A shaded shape element 902 represents the visible area of the two 2D polygons 814a and 814b of the target 816. Drawn around the visible area 902 of the target 816 is a rectangular bounding box 904. The bounding box 904 may include a bottom edge 906. Associated with the bounding box 904 is a marked location 908 indicated by a point. The actor/target location extraction engine 222 may utilize the midpoint of bottom edge 906 of the bounding box 904 as the marked location for the respective bounding box 904.

Figure 6D:
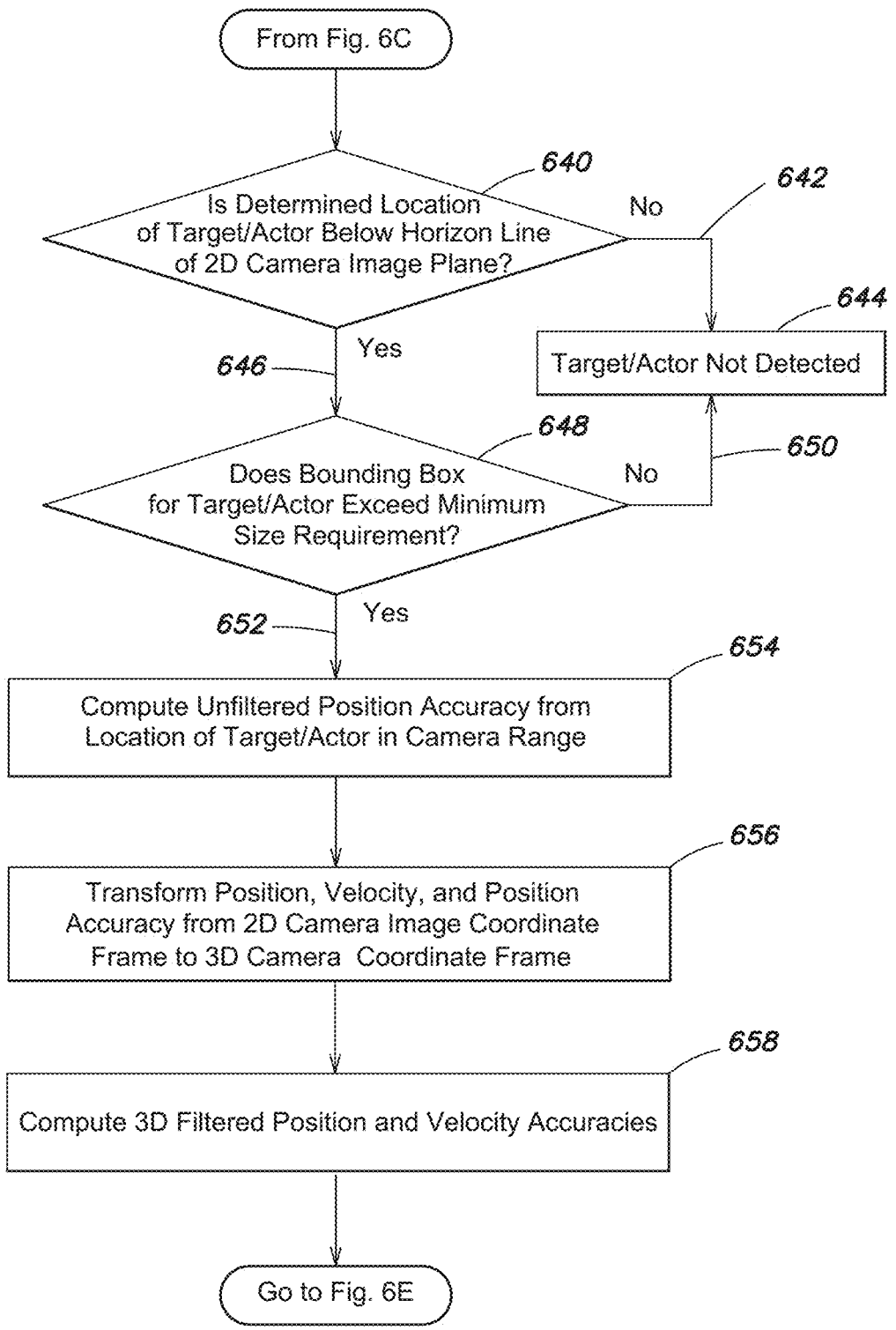

The actor/target location extraction engine 222 may determine whether the location of the given actor is below the horizon line 'u' 516 (FIG. 5) of the 2D pixel image plane 800, as indicated at decision step 640 (FIG. 6D). If the location is not below the horizon line 'u' 516, then the given actor may be deemed not detected, as indicated by No arrow 642 leading to step 644. This test may be performed on the extracted point 908. While other parts of a vehicle, such as the roof, may lie above the horizon, the extracted point 908 may need to lie below the horizon for the actor to be detected. If the location of given actor is below the horizon line, the actor/target location extraction engine 222 may determine whether the bounding box for the given actor exceeds a minimum size requirement, as indicated by Yes arrow 646 leading to decisions step 648. This determination may be based on, e.g., a function of, the MaxRange and MinObjectImageSize parameters. If the MaxRange is set to 100 meters (m) and the object's location computed in step 638 is at a range of 90 m from the sensor's mounted location, then the object's detection will be reported, as 90≤100 is true. However, if the object's location is at a range of 110 m from the sensor's mounted location, then the object's detection is not reported, as 110≤100 is false. If the bounding box computed in step 636 is has a width and height (defined as number of rows and columns occupied by the box in the image) which is ≥ the MinObjectImageSize parameters, the detection will be reported. For example, if the MinObjectImageSize parameters are set to 10 and 15 pixels and the bounding box has a height of 15 and a width of 20 pixels, then the detection will be reported since both the bounding box's height, 15, is greater than the minimum object image height, 10, and the bounding box's width, 20, is greater than the minimum object image width, 15. If either the bounding box's height is less than 10 or its width is less than 15, or both its height is less than 10 and its height is less than 15, then the detection for this object will not be reported. If the bounding box does not exceed the minimum size requirement, the given actor may be deemed not detected, as indicated by No arrow 650 leading to step 644.

If the bounding box for the given actor exceeds the minimum size requirement, the actor/target location extraction engine 222 may compute an unfiltered position accuracy from the location of the given actor in the 2D pixel image plane 900, as indicated by Yes arrow 652 leading to step 654. Unfiltered position accuracy may refer to the actor's position before the introduction of measurement noise. For example, in some embodiments, sensor, e.g., camera, accuracy may be modeled when generating target location and velocity measurements, and the accuracies may be reported by the model 202 together with the target location and velocity measurements. The target location and velocity may be reported in terms of Cartesian coordinates, and accuracies may be reported in terms of covariance matrices. The accuracy of the measured location and velocity of a given target may be a function of one or more of the camera's intrinsics, such as focal point, principal point, etc., and the camera's mounting, e.g., its height. The resolution of the camera's detector may be limited to an individual pixel. Accordingly, the location of a given target (or equivalently, its side) is known with an accuracy of the width of a pixel. In other words, the measured position of a given target may be uniformly distributed across the width and the height of a pixel. As a convention, u may denote the location of a pixel along the image's horizontal axis (columns), with positive values pointing to the right, and v may denote the location of a pixel along the image's vertical axis (rows), with positive values increasing in a downward direction. The pair (u,v) may refer to the location of the given target in the 2D pixel image coordinate frame 900, and the pair (x,y) may refer to the location of the given target in the 3D camera coordinate frame 132.

The coordinate frame transformation engine 216 may transform the position, velocity, and position accuracy of the given target from the 2D pixel image coordinate frame 900 to the 3D camera coordinate frame 132, as indicated at step 656. This transformation may involve the following steps:

1. Compute a 1-by-3 translation vector (T) from the camera's extrinsic parameters: yaw, pitch, roll, sensor location, and height, which describes the translation from origin of the ego vehicle's coordinate frame 112 to the principal point of the camera.
2. Compute a 3-by-3 rotation matrix (R) from the camera's extrinsic parameters: yaw, pitch, and roll.
3. Compute the camera's 3-by-3 intrinsic matrix ($M_I$) using intrinsic parameters: focal length, principal point, skew, radial distortion, and tangential distortion.
4. Assemble a 4-by-3 camera matrix as:

a. $M_C = \begin{bmatrix} R \\ T \end{bmatrix} M_I$

5. Assemble the ego to image 3-by-3 transformation matrix from the rows 1, 2, and 4 of the 4-by-3 camera matrix, $M_c$, as:

a. $M_{e2i} = \begin{bmatrix} m_{c11} & m_{c12} & m_{c13} \\ m_{c21} & m_{c22} & m_{c23} \\ m_{c41} & m_{c42} & m_{c43} \end{bmatrix}$ 6. Compute the image to ego 3-by-3 transformation matrix as the inverse of the ego-to image transformation matrix a. $M_{i2e} = M_{e2i}^{-1}$ 7. Convert from the image coordinates (u,v) to the ego vehicle coordinates:

a. $[x' \ y' \ z'] = [u \ v \ 1] M_{e2i}^{-1}$ b. $x = \dfrac{x'}{z'}, y = \dfrac{y'}{z'}, z = 0$ In some embodiments, the coordinate frame transformation engine 216 may utilize the following transformation process:

Image to Ego Position Transformation

The relationship between a point in 3-D ego coordinates (x,y,z) and its location in a camera's image plane (u,v) is given by:

$$D = C^{-1} \qquad \text{(Eq. 1)}$$

where, C is a 2D homography matrix, and may be given by:

$$C = \begin{bmatrix} m_{11} & m_{12} & m_{13} \\ m_{21} & m_{22} & m_{23} \\ m_{41} & m_{42} & m_{43} \end{bmatrix}$$

$$M = \begin{bmatrix} R \\ T \end{bmatrix} \begin{bmatrix} f_u & 0 & 0 \\ s & f_v & 0 \\ p_u & p_v & 1 \end{bmatrix} = \begin{bmatrix} m_{11} & m_{12} & m_{13} \\ m_{21} & m_{22} & m_{23} \\ m_{31} & m_{32} & m_{33} \\ m_{41} & m_{42} & m_{43} \end{bmatrix}$$

Where R is a 3×3 orientation matrix describing the rotation from the camera's coordinate frame 132 to the ego coordinate frame 112 and T is a 1×3 vector representing the translation of the camera's principal point from the ego frame's origin 114.

$f_u$ and $f_v$ are the camera's focal length in pixels. Exemplary values are approximately 500 to 1000, such as 800.

$p_u$ and $p_v$ define the camera's principal point, e.g., where the camera's origin is. This may be close to half of the camera's image size. For example, for a camera with an image size of 480×640 (height-by-width), the principal point may be something close to: $p_u$=240 and $p_v$=320, where height and width are flipped in this convention for defining image size and principal point.

s is the skew of the camera's axes. It is 0 if the axes are perpendicular. It may be expressed as: fv*tan(<skew angle>). An exemplary value is near 0.

Together, R and T may completely define the camera's extrinsic parameters.

$R = R_2 R_1$ $T = [Y_o \ x_o \ z_o] R_1$

The rotation matrices may be defined as follows:

$R_1(\text{yaw,pitch,roll}) = R_z(\text{yaw}) R_x(90-\text{pitch}) R_z(\text{roll})$ $R_2 = R_y(180) R_z(-90)$ $$R_x(\theta) = \begin{bmatrix} 1 & 0 & 0 \\ 0 & \cos(\theta) & -\sin(\theta) \\ 0 & \sin(\theta) & \cos(\theta) \end{bmatrix}$$

-continued $$R_y(\theta) = \begin{bmatrix} \cos(\theta) & 0 & \sin(\theta) \\ 0 & 1 & 0 \\ -\sin(\theta) & 0 & \cos(\theta) \end{bmatrix}$$

$$R_z(\theta) = \begin{bmatrix} \cos(\theta) & -\sin(\theta) & 0 \\ \sin(\theta) & \cos(\theta) & 0 \\ 0 & 0 & 1 \end{bmatrix}$$

Returning to Eq. 1 above:

$$[x' \ y' \ z'] = [u \ v \ 1]D$$

$$x = \frac{x'}{z'}$$

$$y = \frac{y'}{z'}$$

$$z = 0$$

where, x, y, and z may be in the ego vehicle coordinate frame 112, and x is longitudinal position of the object, y is the lateral position of the object, and z is the height of the object above the horizontal plane defined by the x and y axes 116 and 118 of the ego vehicle coordinate frame 112. In some embodiments, it may be assumed that all objects detected by the camera lie on this horizontal plane, e.g., for all objects their z position in the ego vehicle coordinate frame 112 may be assumed to be zero, e.g., $z_{ego}$=0.

Figure 17:
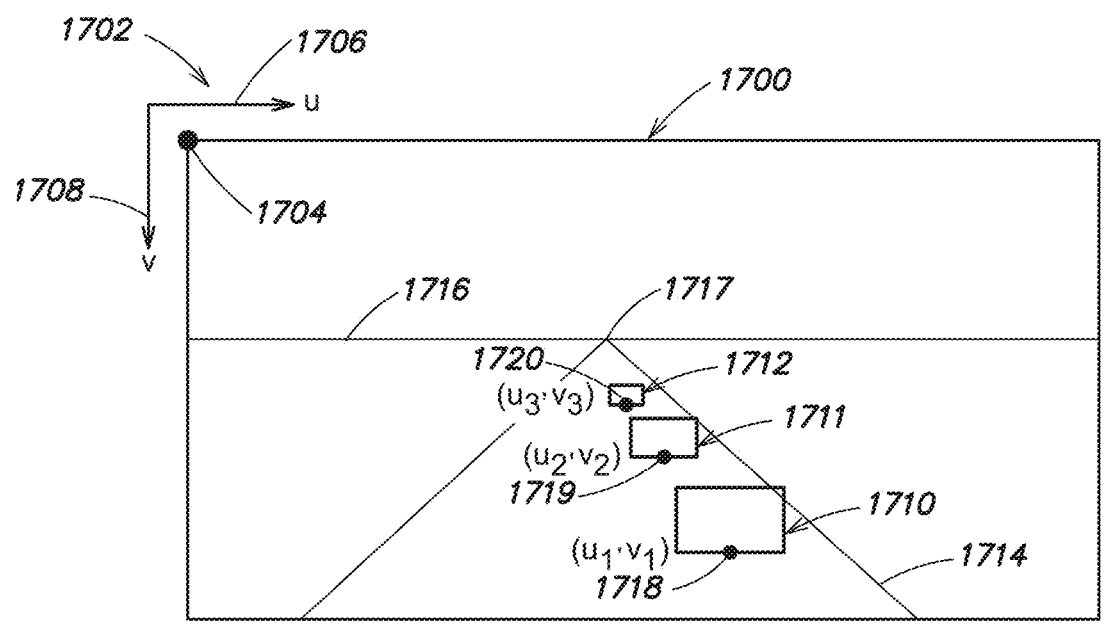
FIG. 17 is a schematic illustration of an example 2D sensor image plane in accordance with one or more embodiments.

FIG. 17 is a schematic illustration of an example 2D sensor image plane 1700 in accordance with one or more embodiments. The 2D image plane 1700 includes a pixel coordinate frame 1702 having an origin 1704, a horizontal axis 'u' 1706, and a vertical axis 'v' 1708. Illustrated on the image plane 1700 are three bounding boxes 1710-1712, which may represent cars traveling along a flat road 1714 that leads toward a horizon 1716. As illustrated, instead of appearing parallel to each other, the sides of the road 1714 may appear to meet at a vanishing point 1717 on the horizon 1716. Points 1718-1720 may be defined for each of the bounding boxes 1710-1712, for example at a midpoint of the bottom edges of the boxes 1710-1712. The bounding boxes 1710-1712 and the points 1718-1720 may be determined by the vision sensor detection synthesis model 202, as described. For the points 1718-1720, the vision sensor detection synthesis model 202 may extract the corresponding image positions in pixels, e.g., ($u_1$, $v_1$), ($u_2$, $v_2$), and ($u_3$, $v_3$), e.g., row and column values.

The vision sensor detection synthesis model 202 may compute a range value for each car from the extracted image positions (u,v), for example by applying the described Image to Ego Position Transformation process to map the image positions, (u,v), of the points 1718-1720 into corresponding x, y, and z points in the ego vehicle's coordinate frame 112. As noted, all objects, e.g., the cars represented by the bounding boxes 1710-1712, may be assumed to lie on the horizontal plane, e.g., $z_{ego}$=0. Upon determining x and y values in the ego vehicle coordinate frame 112, the vision sensor detection synthesis model 202 may use a distance calculation formula, e.g., distance=$\sqrt{x^2+y^2+z^2}$ to compute a range for each detected object, e.g., each of the cars represented by the bounding boxes 1710-1712 and points 1718-1720. Detected objects appearing higher up on the image plane 1700, e.g., closer to the horizon 1716, will have larger range values than detected objects appearing lower down on the image plane 1700. For example, the range value computed for the car represented by the bounding box 1712 will be higher than the range value computed for the car represented by the bounding box 1711, which in turn will be higher than the range value computed for the car represented by the bounding box 1710. An object at the horizon 1716 may have an infinite range.

A monocular camera system may be unable to distinguish between flat and hilly roads when computing range information, and the vision sensor detection synthesis model 202 may model this limitation. For example, if a detected object appears higher up on an image plane, for example because it is a car that is on a hill relative to the ego vehicle, the range value reported by the vision sensor detection synthesis model 202 for that car may be greater than the car's true range. Similarly, if a detected object appears lower down on an image plane, for example because it is a car descending a hill relative to the ego vehicle, the range value reported by the model 202 may be less than the car's true range. For example, if a detected object is on a hill, such as object 503 (FIG. 5), its extracted detected point lies above the horizontal plane at the ego vehicle. This moves the object's detected point up in the camera's imaging plane, which has the same effect as an object being positioned far away from the camera, i.e., approaching the horizon line. In this case, when the extracted point is mapped from the camera's image frame back to the ego frame, the extracted point on the hill may be interpreted as a point on the horizontal plane which is far from the camera sensor, as since all points are assumed by the camera to have z=0 in this transformation.

In some embodiments, inputs to the model 202 may be in terms of the ego vehicle coordinate frame 112. Conversion from the scenario frame 122 to the ego vehicle coordinate 112 may be performed prior to calling or accessing the model 202.

Image to Ego Velocity Transformation

The velocities may be transformed by using the position transformation defined above and computing the partial derivatives:

$$\dot{x} = \left(d_{11}\frac{1}{z'} - d_{13}\frac{x'}{z'^2}\right)\dot{u} + \left(d_{21}\frac{1}{z'} - d_{23}\frac{x'}{z'^2}\right)\dot{v}$$

$$\dot{y} = \left(d_{12}\frac{1}{z'} - d_{13}\frac{y'}{z'^2}\right)\dot{u} + \left(d_{22}\frac{1}{z'} - d_{23}\frac{y'}{z'^2}\right)\dot{v}$$

$$\dot{z} = 0$$

where $$\begin{bmatrix} d_{11} & d_{12} & d_{13} \\ d_{21} & d_{22} & d_{23} \end{bmatrix}$$

is the matrix, D, from Eq. 1. While D may be a 3×3 matrix, only 6 of the components may be used as it may be assumed there is no z velocity component.

Position Accuracy in Ego Coordinate Frame

The unfiltered position accuracy in ego coordinates may also be found by using the position transformation to compute the necessary derivatives:

$$D = C^{-1}$$

$$P_0 = \begin{bmatrix} \sigma_{xx}^2 & \sigma_{xy}^2 \\ \sigma_{xy}^2 & \sigma_{yy}^2 \end{bmatrix}$$

$$\sigma_{xx}^2 = \left(\frac{dx}{du}\sigma_u\right)^2 + \left(\frac{dx}{dv}\sigma_v\right)^2$$

$$\sigma_{yy}^2 = \left(\frac{dy}{du}\sigma_u\right)^2 + \left(\frac{dy}{dv}\sigma_v\right)^2$$

$$\sigma_u = \sigma_v = \frac{1}{2}\frac{\Delta}{\sqrt{3}}$$

Where $\Delta$ is the detector's bounding box accuracy in pixels, and the partials are given by the matrix, D:

$$\frac{dx}{du} = d_{11}\frac{1}{z'} - d_{13}\frac{x'}{z'^2}$$

$$\frac{dx}{dv} = d_{21}\frac{1}{z'} - d_{23}\frac{x'}{z'^2}$$

$$\frac{dy}{du} = d_{12}\frac{1}{z'} - d_{13}\frac{y'}{z'^2}$$

$$\frac{dy}{dv} = d_{22}\frac{1}{z'} - d_{23}\frac{y'}{z'^2}$$

And the cross correlation may be given by:

$$\rho = \frac{y}{x}$$

$$\sigma_{xy}^2 = \rho\sqrt{\sigma_{xx}^2}\sqrt{\sigma_{yy}^2}$$

The model 202 may store, e.g., save or log, position information in memory, for example for use in computing speed and/or velocity.

Returning to FIG. 6D, the actor/target location extraction engine 222 may compute 3D filtered position and velocity accuracies for the given target, as indicated at step 658. In some embodiments, this computation may assume a constant velocity Kalman filter using a piecewise constant white acceleration model, such as discrete white noise acceleration (DWNA). In this case, the state transition matrix may be given as:

$$F_1 = \begin{bmatrix} 1 & T \\ 0 & 1 \end{bmatrix}$$

$$F = \begin{bmatrix} F_1 & 0 \\ 0 & F_1 \end{bmatrix}$$

where T is the measurement update interval.
The process noise matrix may be given as:

$$Q_1 = \begin{bmatrix} \frac{T^4}{4} & \frac{T^3}{2} \\ \frac{T^3}{2} & T^2 \end{bmatrix}\sigma_v^2$$

$$Q = \begin{bmatrix} Q_1 & 0 \\ 0 & Q_1 \end{bmatrix}$$

Where $\sigma_v$ is the process noise intensity for the Kalman filter, which may be specified, programmatically or by the user, through the ProcessNoiseIntensity parameter. It may determine how much measurements are smoothed by the Kalman filter with larger values having less smoothing and smaller values creating more smoothing.

The observation matrix may be given as:

$$H = \begin{bmatrix} 1 & 0 & 0 & 0 \\ 0 & 0 & 1 & 0 \end{bmatrix}$$

The system matrix may be given by:

$$P_f = H^T P_0^{-1} H$$

$$H_f = \begin{bmatrix} A^{-T} & A^{-T}R_f \\ QA^{-T} & A + QA^{-T}R_f \end{bmatrix}$$

The actor/target location extraction engine 222 may compute the Eigen-decomposition of $H_f$, such that:
$H_f = W\Lambda W^H$
Where $\Lambda$ and W may be partitioned as:

$$\Lambda = \begin{bmatrix} \Lambda_1 & 0 \\ 0 & \Lambda_1^{-1} \end{bmatrix}$$

$$W = \begin{bmatrix} W_{11} & W_{12} \\ W_{21} & W_{22} \end{bmatrix}$$

The predicted steady-state covariance may be found as:
$P_p = W_{21}W_{11}^{-1}$
And the filtered steady-state covariance may be computed from the predicted covariance:
$P_f = (P_p^{-1} + H^T R^{-1} H)^{-1}$
which may be partitioned as:

$$P_f = \begin{bmatrix} P_{f11} & P_{f12} \\ P_{f21} & P_{f22} \end{bmatrix}$$

The 3D filtered position and velocity covariance matrices for the given target may then be given by:

$$P_{pos} = \begin{bmatrix} P_{f11} & 0 \\ 0 & \sigma_{zz}^2 \end{bmatrix}$$

$$P_{vel} = \begin{bmatrix} P_{f22} & 0 \\ 0 & \sigma_{\dot{z}\dot{z}}^2 \end{bmatrix}$$

Where $\sigma_{zz}$ and $\sigma_{\dot{z}\dot{z}}$ may be large values used to represent the large uncertainty of the measurement's position and velocity in the z-dimension.

Figure 6E:
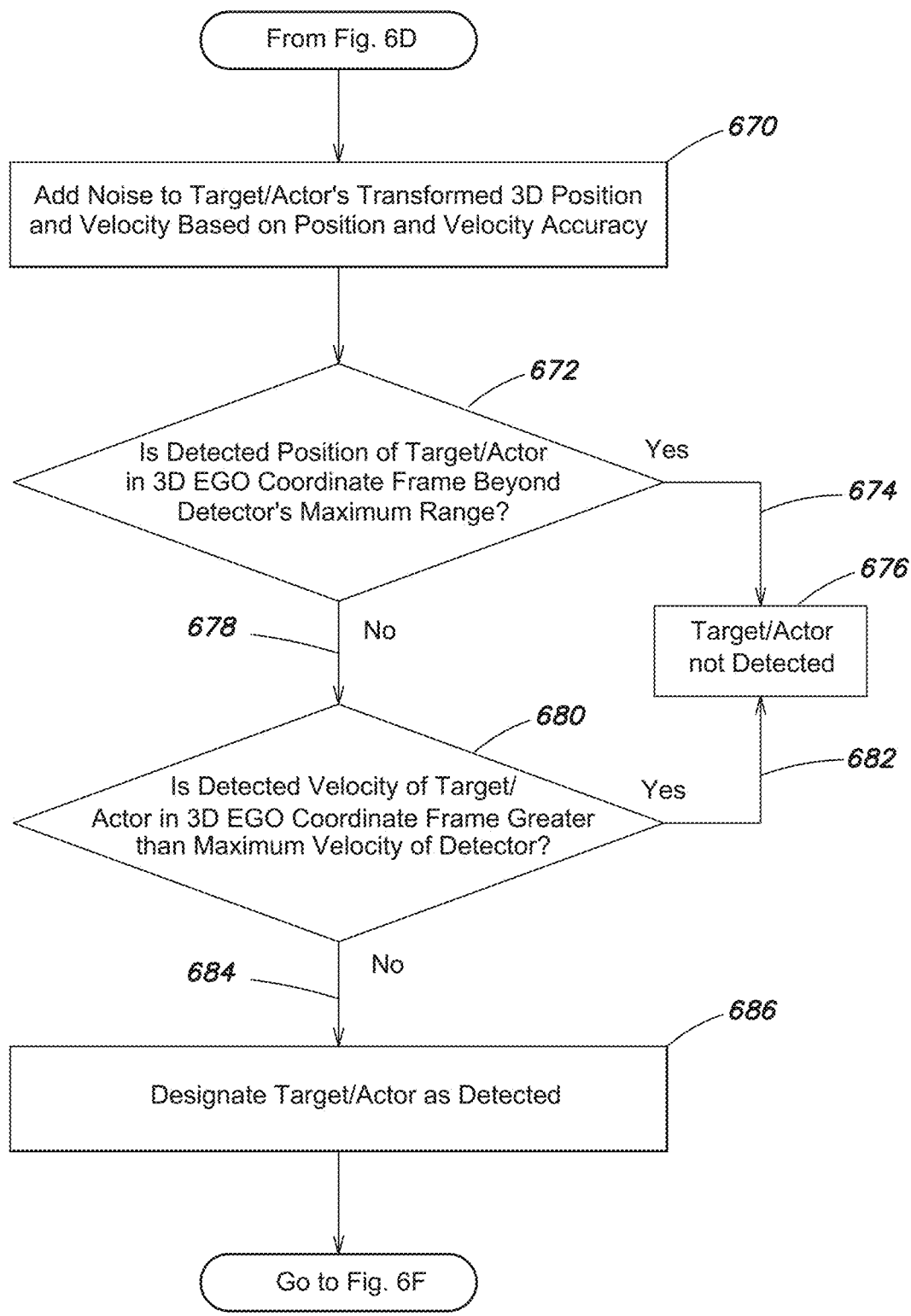

Processing may continue at FIG. 6E. The noise generator engine 226 may add measurement noise to the position and/or velocity computed for the given target, as indicated at step 670. Measurement noise may refer to unwanted variation in pixel values that make an image a less than exact representation of an original scene. The amount of noise introduced to an image may vary depending on the level of illumination of the scene and the quality of the sensor. For example, low quality sensors may introduce more noise than high quality sensors. Noise may manifest in an image as graininess in darker background areas, as faint horizontal or vertical lines, and in low contrast images.

The noise generator engine 226 may determine whether the HasNoise parameter is asserted. If not, the noise generator engine 226 may not introduce measurement noise. If the HasNoise parameter is asserted, the noise generator engine 226 may introduce measurement noise to the position and/or velocity computed for a given target. In some embodiments, the noise generator engine 226 may apply a Gaussian distribution of noise for each pixel of the sensor.

Figure 15:
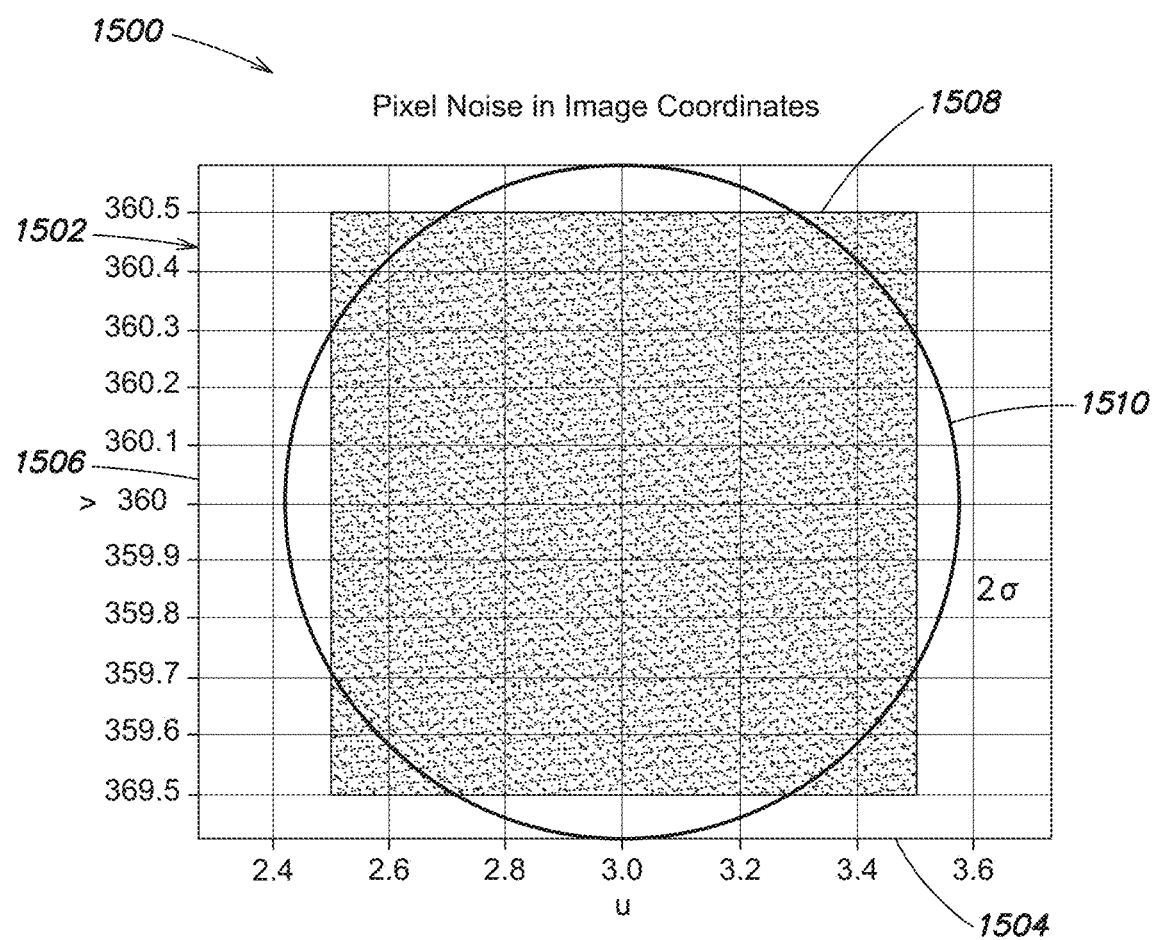
FIG. 15 is a schematic illustration of an example plot of a noise distribution for a pixel in accordance with one or more embodiments.

FIG. 15 is a schematic illustration of an example plot 1500 of noise distribution for a pixel in accordance with one or more embodiments. The plot 1500 includes a pixel coordinate frame 1502 having an x-axis 1504 labeled 'u' and a y-axis 1506 labeled 'v'. The plot 1500 illustrates a noise distribution 1508 for a pixel located at row 360, column 3. The noise distribution 1508 may be a Gaussian distribution. The plot 1500 includes a marking 1510 in the form of a circle representing the standard deviation for the Gaussian distribution. In some embodiments, the same Gaussian distribution may be used for each pixel. In other embodiments, different distributions may be used at different pixels. In some embodiments, distributions other than uniform distributions may be utilized.

Figure 16:
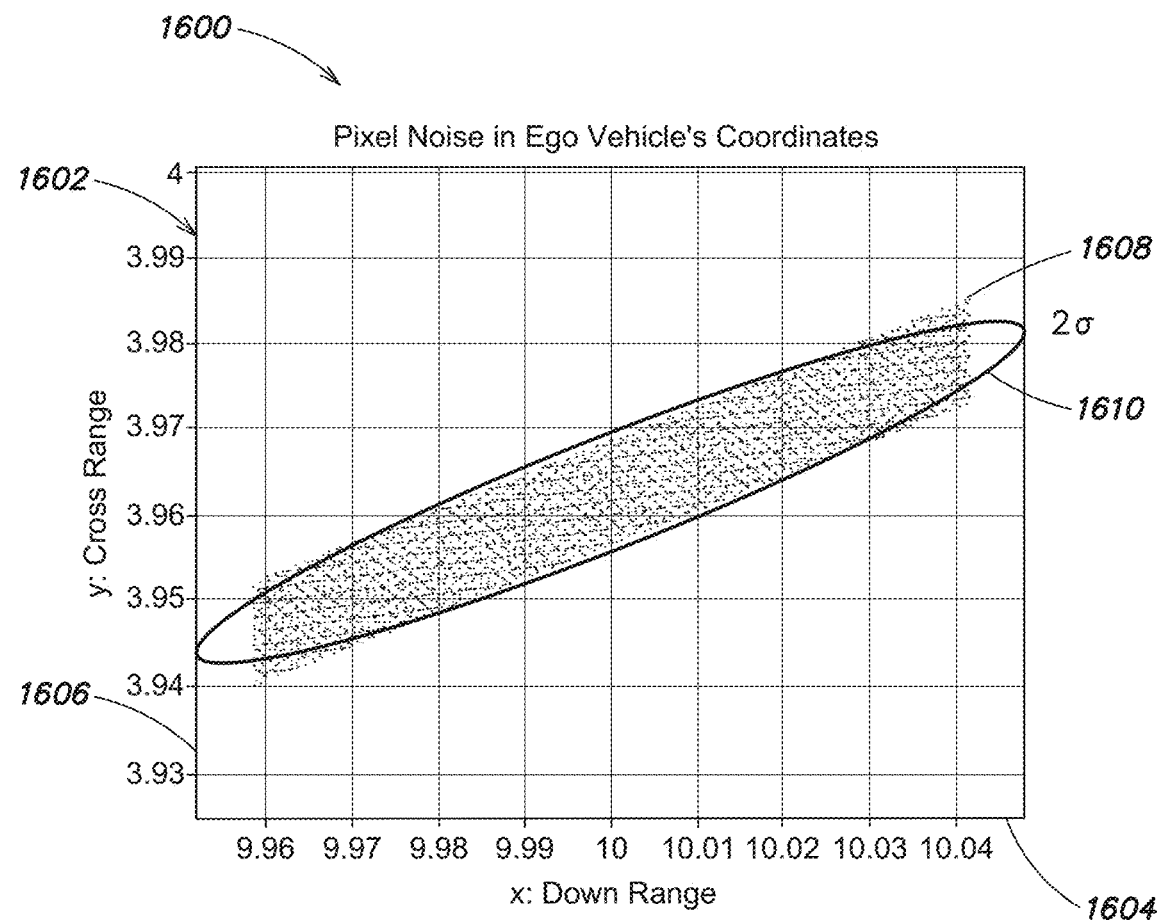
FIG. 16 is a schematic illustration of an example plot of the noise distribution of FIG. 15 in a vehicle coordinate frame in accordance with one or more embodiments.

The noise generator engine 226 may perform a spatial correlation of the noise distributions specified for the pixels of the sensor to pixel noise in the ego vehicle coordinate frame 112. FIG. 16 is a schematic illustration of an example plot 1600 of the pixel noise distribution of FIG. 15 as translated to the ego vehicle coordinate frame in accordance with one or more embodiments. The plot 1600 includes a 2D ego vehicle coordinate frame 1602 having an x-axis 1604 labeled 'x: down range' and a y-axis 1606 labeled 'y: cross range'. The plot 1600 illustrates that the pixel at row 360, column 3 as illustrated in FIG. 15 spatially correlates to a location having an 'x' value of 10 and a 'y' value of 3.96. The plot 1600 includes a noise distribution 1608, which results from the spatial correlation of the Gaussian noise distribution 1508 for the pixel of FIG. 15. The plot 1600 also includes a marking 1610 in the form of an ellipse 1610 representing the standard deviation for the Gaussian distribution.

In an embodiment, the noise generator engine 226 utilizes the noise distribution 1608 in the vehicle ego frame 112 to compute a noise measurement for the position and/or velocity of the object.

As described, the noise generator engine 226 may map pixel noise utilizing the transformation from the camera coordinate frame to the ego vehicle coordinate frame 112. FIG. 15 illustrates the noise completely uncorrelated, and FIG. 16 shows the noise correlated, e.g., due to the camera's intrinsics, the camera's extrinsics, and the location of the object in the camera's imaging plane.

The actor/target location extraction engine 222 may determine whether the detected position of the given target in the 3D ego coordinate frame 112 is beyond the detector's maximum range (MaxRange), as indicated at decision step 672. If so, the model 202 may determine that the given target is not detected, as indicated by Yes arrow 674 leading to step 676.

If the detected position of the given target is not beyond the detector's maximum range, the actor/target location extraction engine 222 may determine whether the detected velocity for the given target is greater than the maximum velocity of the detector (MaxSpeed), as indicated by No arrow 678 leading to decision step 680. If the velocity exceeds the maximum velocity that can be detected, then the model 202 determines that the given target is not detected, as indicated by Yes arrow 682 leading to step 676.

If the detected velocity of the given target is not greater than the maximum velocity, then the model 202 may designate the given target as detected by the camera 108, as indicated by No arrow 684 leading to step 686.

Figure 6F:
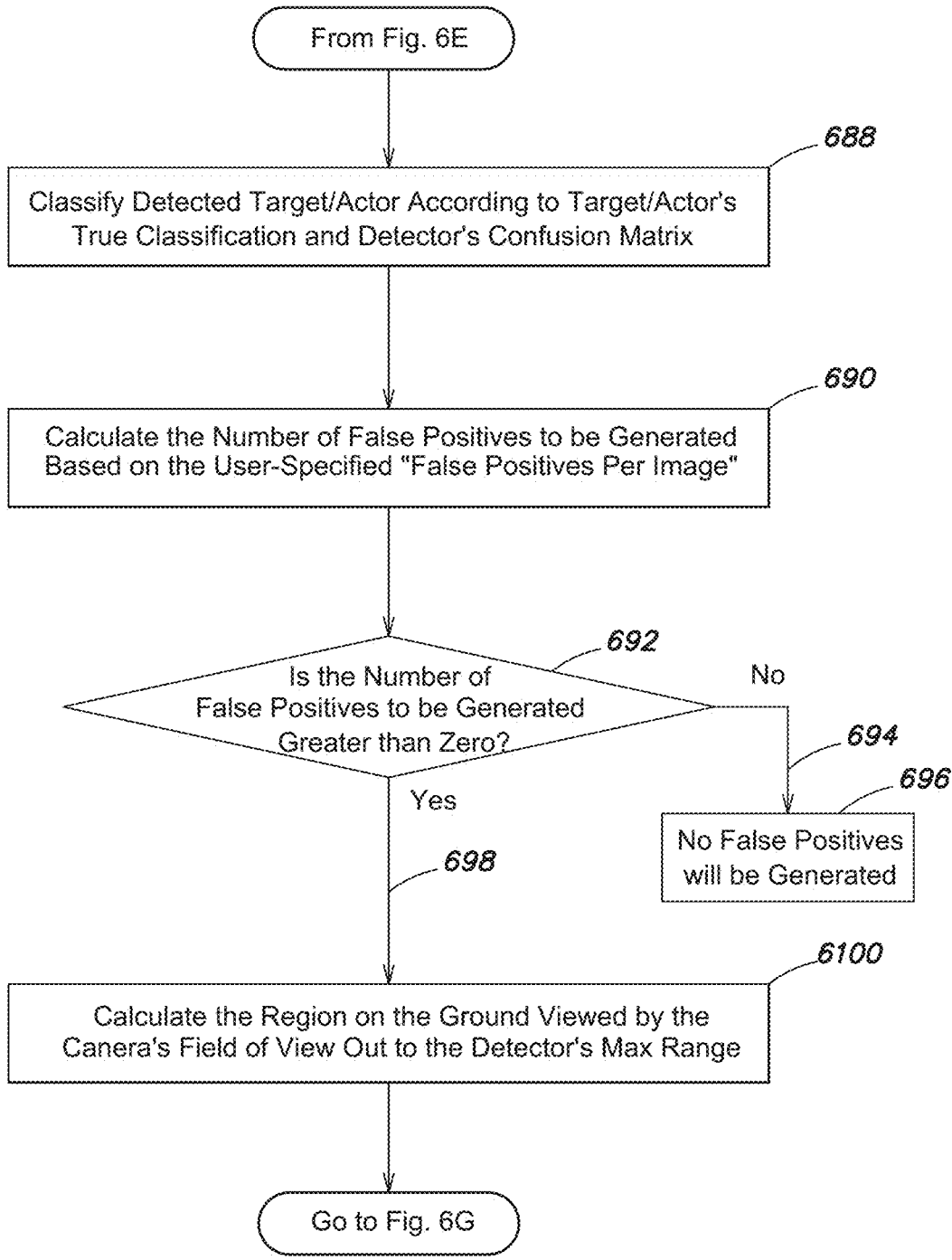

The classification engine 228 may classify the detected target, as indicated at step 688 (FIG. 6F). In an embodiment, the classification engine 228 may generate a classification for the given target based on the target's true classification and a confusion matrix.

FIG. 10 is a schematic illustration of an example confusion matrix 1000 in accordance with one or more embodiments. The confusion matrix 1000 may include rows and columns whose intersections define entries, cells, or records that store information. For example, the confusion matrix 1000 may include columns for the ClassIDs with which the sensor is configured, such as columns 1002-1005 for ClassIDs 0, 1, 2, and 3, which may represent unknown, car, truck, and van, respectively. The confusion matrix 1000 also may include rows for the true ClassIDs assigned to the actors in the scenario, such as rows 1006-1009 for ClassIDs 1, 2, 3, and 4, which may represent car, truck, van, and pedestrian, respectively. The entries, cells, or records may store percentage values that represent the frequency with which the sensor correctly classifies a given actor. For example, with reference to row 1007, if the sensor was detecting a truck, it would assign the detection the unknown classification 5% of the time, the car classification 5% of the time, the truck classification, i.e., the correct classification, 80% of the time, and the van classification 10% of the time.

In some embodiments, a user may specify the detector's ClassIDs and the percentages.

Figure 6G:
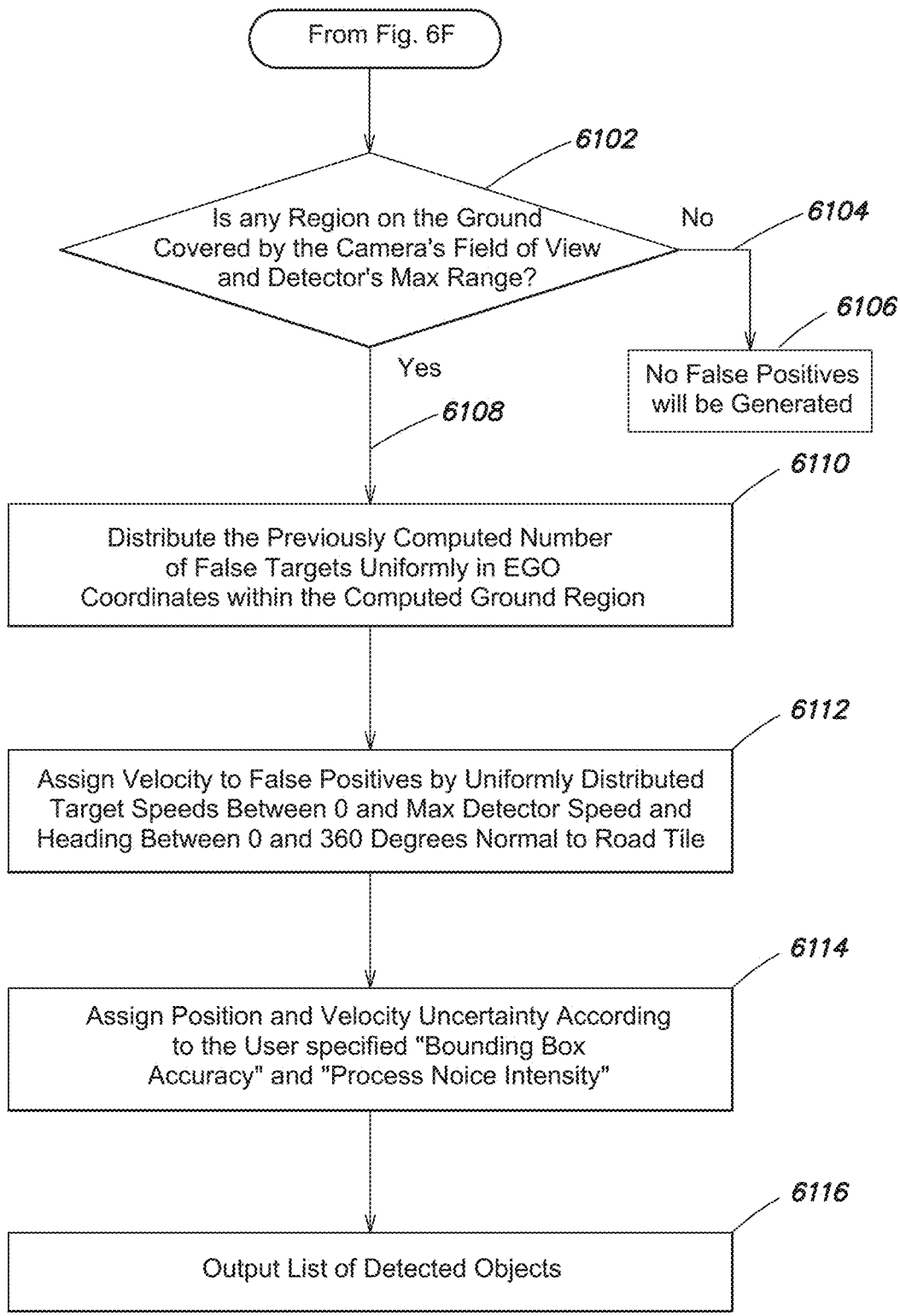

Returning to FIG. 6F, the false positive generator 230 may calculate a number of false positives to be generated, as indicated at step 690. This determination may be a function of the FalsePositivesPerImage parameter. The false positive generator 230 also may determine whether the number of false positives to be generated is greater than zero, as indicated by decision step 692. If not, the false positive generator 230 may not generate any false positives, as indicated by No arrow 694 leasing to step 696. If the number of false positives to be generated is greater than zero, the false positive generator 230 may next calculate the region on the ground viewed by the camera's field of view out to the detector's maximum range, as indicated by Yes arrow 698 leading to step 6100. The false positive generator 230 may then determine whether any region on the ground is covered by the camera's field of view and the detector's maximum range, as indicated by decision step 6102 (FIG. 6G). If not, no false positives may be generated, as indicated by No arrow 6104 leading to step 6106. If the response to decision step 6102 is yes, the false positive generator 230 may distribute the number of false positives within the ground region, as indicated by Yes arrow 6108 leading to step 6110. In some embodiments, the false positive generator 230 may uniformly distribute the false positives in the ego vehicle coordinate frame 112.

The false positive generator 230 may assign velocities to one or more of the false positives, as indicated at step 6112. In some embodiments, the assigned velocities may be between zero and the MaxSpeed parameter, and the headings of the false positives may be between zero and 360 degrees normal to the respective road tile. In some embodiments, values may be assigned by a uniform random variable whose bounds are defined by the respective parameters. For example, if MaxSpeed is 100, then a false positive may be assigned a speed which is a random number taken from a uniform distribution between 0 and 100, i.e., [1, 100]. The false positive generator 230 also may assign position and velocity uncertainty to the one or more false positives, as indicated at step 6114. The assigned position and velocity uncertainty may be a function of the BoundingBoxAccuracy and ProcessNoiseIntensity detector parameters.

The false positive generator 230 thus simulates the generation of detections that do not correspond to actual objects in the environment, which is a condition or artifact of actual sensors. For example, a camera sensor may incorrectly identify a shadow, a patch of grass, or almost anything in the environment as a detection, and such detections will be passed by the camera sensor to the control algorithms. The model 202 including the false positive generator 230 can thus test, e.g., stress, such control algorithms during design, development, verification, or testing by presenting false positives, to ensure that the algorithms do not respond to such false positives in an undesired manner, e.g., in a way that might be adverse to a vehicle's operation.

In some embodiments, inputs to the model 202 may include geometric shapes, including curves or sampled points, that may represent lane and road markings present on a road. These may be converted from the scenario frame 122 to the ego vehicle coordinate 112 prior to calling or accessing the model 202. The embodiments may generate positional information in the form of sampled points along the length of the curve, projected into a two dimensional (2D) image, e.g. pixel, coordinates commensurate with the Object Detection Model parameters, 210, for the same or similar camera 108 being modeled. Occlusion of road and other markings may be modeled by subtracting out the projection of the geometrically modeled objects from the curves or markings.

The vision sensor detection synthesis model 202 may output the detected objects, as indicated at step 6116. In some embodiments, the vision sensor detection synthesis model 202 may output a list of detected objects, which may include the one or more false positives. The list of detected objects may include the time of detection and, for each detected object and each false positive:
position measurement;
velocity measurement;
measurement accuracy, e.g., a 6×6 covariance matrix); and
object classification.

The vision sensor detection synthesis model 202 may output detections at a predetermined interval, which may be user specified. For example, the model 202 may be configured to output detections at 0.1-second intervals, which may be consistent with the update rate of automotive vision sensors. Nonetheless, the model 202 may sample, e.g., advance, the scene data 204 at another rate, for example every 0.01 seconds, and make computations at this faster rate, for example to more accurately model the motion of objects, such as vehicles.

As described, the vision sensor detection synthesis model 202 may not generate or create any images from the scene data 204, such as realistic computer graphic images of cars, trucks, pedestrians or other objects generated by gaming engines.

Example Executable Model

Figure 11:
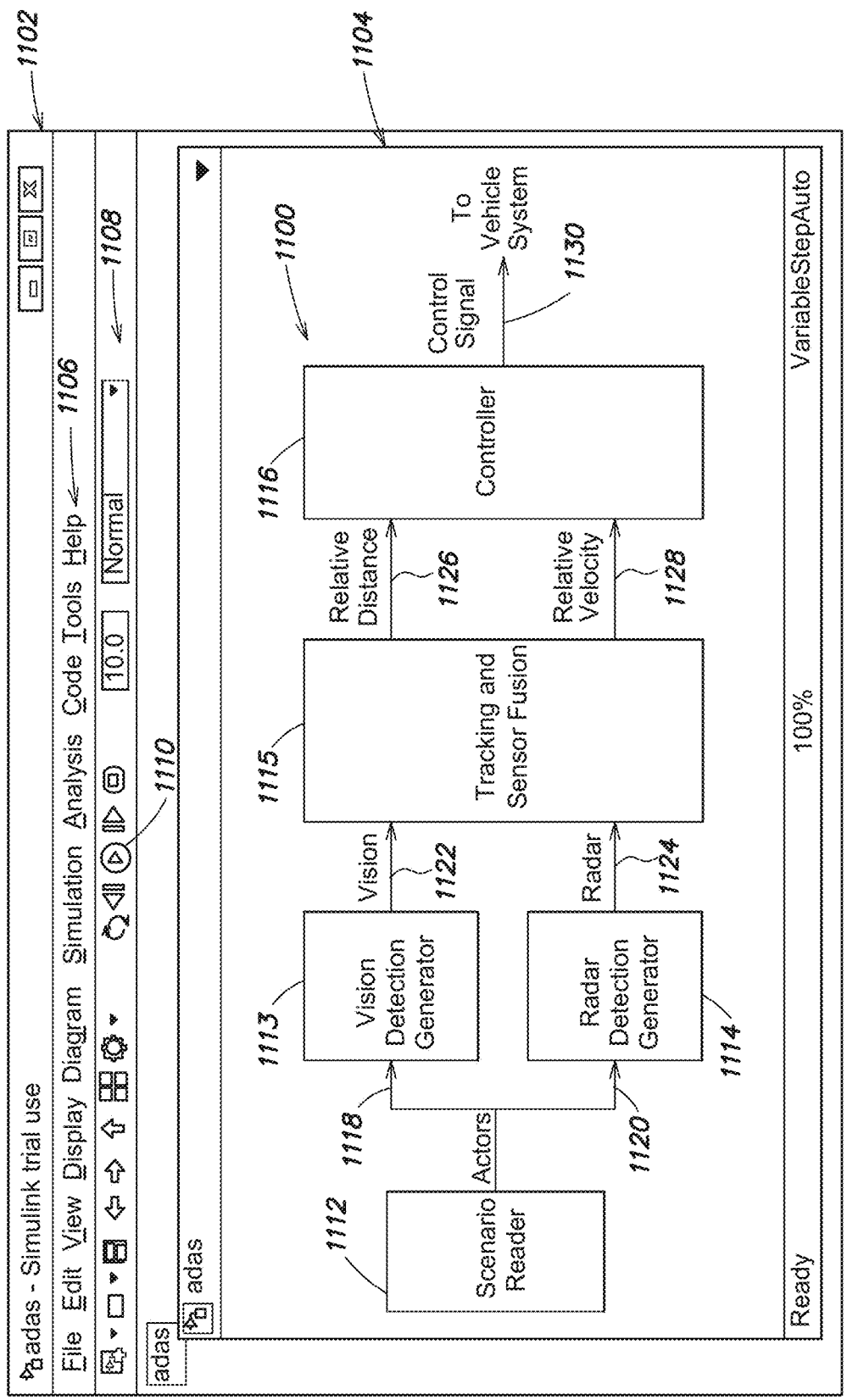
FIG. 11 is an illustration of an example block diagram model in accordance with one or more embodiments.

FIG. 11 is a schematic illustration of an example executable model 1100 in accordance with one or more embodiments. The model 1100 may be a computer-generated block diagram model having executable semantics. The model 1100 may be opened, constructed, and/or edited in a model editor 1102 of a modeling environment. The model editor 1102 may be presented on a display of a data processing system by the modeling environment. The model editor 1102 may include a plurality of graphical affordances, such as user interface elements and/or windows elements (widgets), that may be operated by a user to construct, edit, run, and save the model 1100, among other operations. For example, the model editor 1102 may include a model canvas 1104, and a visual representation of the model 1100 may be represented on the model canvas 1104. In addition to the model canvas 1104, the model editor 1102 may include a menu bar 1106, and a toolbar 1108, among other graphical elements. The menu bar 1106 may include drop down commands, such as File, Edit, View, Display, etc. The toolbar 1108 may include a plurality of command buttons. For example, the toolbar 1108 may include a Run command button 1110. In response to a user selecting the Run command button 1110, for example with a mouse or other pointing device, a simulation engine of the modeling environment may generate executable instructions for executing the model 1100. Execution of the model 1100 may also be referred to as simulation of the model 1100.

The model 1100 may be created by selecting model element types from one or more libraries of the modeling environment, and add instances of the selected model element types to the canvas 1104 to construct or revise the model 1100. Model element types may be presented to a user through one or more palettes displayed on the model editor 1102. Model elements may represent dynamic systems, computations, functions, operations, events, or states. The selected model elements may be represented as blocks or icons in the model 1100. Groups of model elements may be organized as model components that establish hierarchy in the model 1100. At a first hierarchical level, a model component may be visually represented by a single block or icon, such as a subsystem block or a model reference block. Exemplary model components include subsystems and sub-models of the Simulink model-based design environment, Virtual Instruments (VIs) of the LabVIEW programming system, and SuperBlocks of the MatrixX modeling environment. A model component may itself include one or more other components, establishing multiple hierarchal levels through the model 1100.

Model elements and model components may be linked together by connections to establish relationships among model elements and/or model components, for example to exchange information, such as data, control, signals, events, and messages. The connections may establish information paths through the model, which may extend from the model's top-level inputs to its top-level outputs. At least some of the connections may be visually represented in a display of the model 1100, for example, as arrows, wires, lines, etc.

The model 1100 may include a plurality of model components 1112-1116 named 'Scenario Reader', "Vision Detection Generator', 'Radar Detection Generator', 'Tracking and Sensor Fusion', and 'Controller', which may be implemented using subsystem and/or model reference blocks. The Scenario Reader model component 1112 may read actor pose information and road boundary information from one or more files storing scenario data. The Scenario Reader model element 1112 may stream actor poses to the Vision Detection Generator model component 1113 and the Radar Detection Generator model component 1114 as indicated by arrows 1118 and 1120. The Vision Detection Generator model component 1113 may include the vision sensor detection synthesis model 202 (FIG. 2) and may provide synthetic vision detection data to the Tracking and Sensor Fusion model component 1115 as indicated by arrow 1122. The Radar Detection Generator model component 1114 may generate synthetic radar detection data, and may provide that data to the Tracking and Sensor Fusion model component 1115 as indicated by arrow 1124.

The Tracking and Sensor Fusion model component 1115 may compute relative distance and relative velocity data of actors in the scenario relative to an ego vehicle, and may provide this data to the Controller model component 1116 as indicated by arrows 1126 and 1128. The Controller model component 1116 may be designed to implement one or more Advanced Driver Assistance Systems (ADAS) and/or active safety systems, such as the controller for an Adaptive Cruise Control system, among others. The Controller model component 1116 may generate one or more control signals, which may be provided to other model components or models (not shown) that model the ego vehicle, as indicated by arrow 1130.

The arrangement of model elements within a model, such as the model components 1112-116 of the model 1100, may specify a procedure, algorithm, and/or behavior. The model 1100 may represent a dynamic system, and the modeling environment may model the dynamic system represented by the model 1100 as a set of differential, difference, and/or algebraic equations, such as Ordinary Differential Equations (ODEs) and differential-algebraic equations (DAEs), which contain both differential equations and algebraic equations. The model 1100 may be executed, e.g., simulated, by the modeling environment to perform the procedure, algorithm, and/or behavior.

The modeling environment may execute the model 1100. For example, a user may select the Run command button 1110. Alternatively, a user may enter a text-based command in a CLI. The model 1100 may also be executed programmatically. In response, the modeling environment may generate executable instructions for the model 1100. During execution, the model 1100 may process input values, and may generate output values. A user may direct the modeling environment to execute, e.g., run, the model 1100 using sample input data, and may evaluate whether the model 1100, when executed, generates expected output values. If it does not, the user may revise the model 1100. When the user is satisfied that the model 1100 correctly represents the behavior or operation of the system being modeled, e.g., to some degree of accuracy, a code generator may generate code, such as computer source code, for the model.

In some embodiments, model execution may include a compile stage, a link stage, and a simulation loop stage. The compile and link stages may be performed by a model compiler of the modeling environment. The compile stage may mark the start of execution of the model, and may involve preparing data structures and evaluating parameters, configuring and propagating model element characteristics (e.g., sample times, data types, etc.), determining model element connectivity, performing model element reduction and model element insertion, and generating a sorted order of the equations corresponding to the model elements of the model. Model element reduction may include collapsing and/or reducing one or more groups of model elements. For example, model elements or signals determined to be in an unused code path, e.g., dead code, rate transition model elements whose input frequency is faster than their output frequency, and type conversion blocks determined to be unnecessary may be collapsed or removed.

The preparation of data structures and the evaluation of parameters may create and initialize one or more data structures used in the compile stage. For each model element, a method may force the model element to evaluate all of its parameters. During the configuration and propagation of model element and port/signal characteristics, the compiled attributes (such as data dimensions, data types, complexity, sample modes, and sample time) of each model element (and/or ports) may be setup on the basis of the corresponding behaviors and the attributes of model elements (and/or ports) that are connected to the given model element through connections, e.g., arrows. Attributes may also be setup based on the context of a model element or a component in a model. For example, a subsystem that has a given sample time may have this sample time be set to the sample time of model elements included in the subsystem.

The attribute setup may be performed through a process during which model element behaviors "ripple through" the model 1100 from one model element to the next following signal or other connectivity, as well as through the hierarchical structure of the model 1100, and may for example follow connectivity in a forward or backward manner. This process is referred to as "propagation." In the case of a model element that has explicitly specified its model element behaviors or the behaviors of its ports, propagation may help ensure that the attributes of the model element are compatible with the attributes of the model elements connected to it or contained by it. If not, an error may be issued. At least some model elements may be implemented to be compatible with a wide range of attributes. Such model elements may adapt their behavior in accordance with the attributes of the model elements connected to them. The exact implementation of the model element may be chosen on the basis of the model in which the model element is located. Included within this step are other aspects such as validating that all rate-transitions yield deterministic results, and that the appropriate rate transition blocks are being used.

The compilation step also may determine model element connectivity. For example, a model may include one or more virtual blocks that may play no semantic role in the execution of the model. In this step, the virtual blocks may be optimized away, e.g., removed, and the remaining non-virtual model elements may be reconnected to each other appropriately. This compiled version of the model with actual model element connections may be used from this point forward in the execution process.

One or more in memory representations, such as intermediate representations (IRs), may be generated by a model compiler. At least one of the IRs may be in the form of a directed graph, such as a hierarchical, Data Flow Graph (DFG) having a plurality of nodes interconnected by edges. The nodes of the IR may represent model elements from the executable graphical model, the edges of the IR may represent connections among the model's model elements. Special nodes of the IR may be used to provide hierarchy in the IR, for example, by abstractly representing subsystems or other components of the model. In some implementations, model elements of the model may map to one or more nodes of the IR, and lines or arrows of the model may map to one or more edges of the IR.

It should be understood that an IR may take other forms, such as a Control Flow Graph (CFG), Control Data Flow Graph (CDFG), program structure tree (PST), abstract syntax tree (AST), a netlist, etc. A CDFG may capture the control flow as well as the data flow of a graphical model through data dependency and control dependency edges.

The in-memory representation or IR may be stored in memory, such as the main memory or a persistent memory of a data processing device.

Following the compilation stage, code may or may not be generated for the model. If code is generated, the model may be executed through an accelerated execution mode in which the model, or portions of it, is translated into either software modules or hardware descriptions, which is broadly referred to herein as code. If this stage is performed, then the stages that follow may use the generated code during the execution of the model. If code is not generated, the model may execute in an interpretive mode in which the compiled and linked version of the model may be directly utilized to execute the model over the desired time-span. When users generate code for a model, they may choose to not proceed further with the model's execution. For example, they may choose to take the generated code and deploy it outside of the confines of the modeling environment.

The link stage may involve memory allocation, and generation of a block method execution list, e.g., from the sorted order. During the simulation loop stage, the compiled and linked version of the model may be directly utilized by a simulation engine to execute the model in an interpreted mode. The way in which the input and output of model elements are interconnected in the model does not necessarily define the order in which the equations (methods) corresponding to the individual model elements will be solved (executed). The actual order may be determined during the sorting step in compilation.

Alternatively or additionally to model execution, a code generator, which may be included in the modeling environment or may be a separate application, may generate code for at least a portion of the model 1100, such as the ADAS Controller model component 1116. The generated code for the ADAS Controller model component 116 may be utilized in Hardware-in-the-Loop (HIL) testing of the ADAS controller being designed. Alternatively or additionally to model execution and/or HIL testing, code generated for the ADAS Controller model component 116 may be deployed, for example as embedded software on an embedded system or other target hardware platform, such as an electronic control unit (ECU).

The modeling environment and/or a program development environment hosting the modeling environment may support Object Oriented Programming (OOP). In an OOP environment, objects may be created, and the objects may interact with other objects in the environment. Objects may be specific instances of a class, which describes a set of common characteristics. Objects may have behaviors that are common to all objects of a class, and these behaviors are implemented through methods. An object typically encapsulates data and operations. Objects interact with each other and with other entities of the object oriented environment via object interfaces such as function calls and events. Exemplary object oriented programming languages include C++, C #, the MATLAB programming language from The MathWorks, Inc. of Natick, Mass., and the Java programming language from Oracle Corp. of Redwood Shores, Calif., among others.

The MATLAB® technical computing environment is a math-oriented, textual programming environment for digital signal processing (DSP) design, among other uses. The MATLAB environment provides a number of high-level features that facilitate algorithm development and exploration, such as dynamic typing, array-based operations, data type inferencing, sample time inferencing, and execution order inferencing, among others.

Because the scene data 204 is much more rudimentary as compared to scene data generated by a gaming engine, running the vision sensor detection synthesis model 202, e.g., as part of the Vision Detection Generator 1113, is less computationally intensive as running a vision model that utilizes scene data from a gaming engine, for example, the model 202 may not process any images. Instead, all calculations may involve computational geometry. Rather than performing image processing techniques to identify and extract objects from images, objects may be defined in advance as geometric shapes, e.g., cuboids, and the geometric shapes may be rotated and transformed in a 2D coordinate frame to assess whether those geometric shapes, which represent objects, can be detected. Accordingly, a user may re-run the vision sensor detection synthesis model 202 many times changing for example, the camera intrinsics 206 and/or detector parameters 210 to simulate different vision sensors, e.g., cameras. For example, the user might change the camera intrinsics 206 and/or detector parameters 210 to simulate higher and/or lower quality vision sensors, and evaluate the object detection outcomes of these different vision sensors.

A user may chose parameter values to emulate a particular sensor, e.g., camera, then change parameter values to emulate a different sensor, and evaluate its performance with a given controller designer. In this way, a user may determine sensors that are suitable for use with the given controller design. For example, a user may determine when a high end sensor may be necessary and when a low end sensor is suitable, thereby improving the design and cost of controller systems.

By changing the intrinsic values of the sensor being modeled, especially the image size, a user can evaluate different camera models. Increasing the camera's pixels, results in a higher resolution camera, which will have less noise and be able to detect objects further away, when compared to a camera with fewer pixels. A relatively low resolution camera may have an image size of 640×480, while a high resolution camera may have an image size of 800×600. Furthermore, a more accurate detector may be modeled, e.g., by changing the BoundingBoxAccuracy parameter and/or the MinObjectImageSize.

The user might also re-run the vision sensor detection synthesis model 202 after changing the value of the DetectionProbability parameter to simulate the vision sensor's performance under different ambient conditions.

As described, the model 202 allows a user to assess the performance of a control algorithm/system when paired with a particular sensor/detector. The sensor is typically one of the primary inputs to such control algorithms/systems. By changing one or more of the model's parameters, the user can evaluate how sensitive the performance of the control algorithm/system is to those parameters. This can help the user determine which parameters are more important to the operation of the control algorithm/system, and what the acceptable bounds for these parameters are. The model 202 may thus assist the user in selecting an appropriate actual sensor, i.e., one having the determined parameters, for the control algorithm/system being evaluated.

Embedded System

Figure 12:
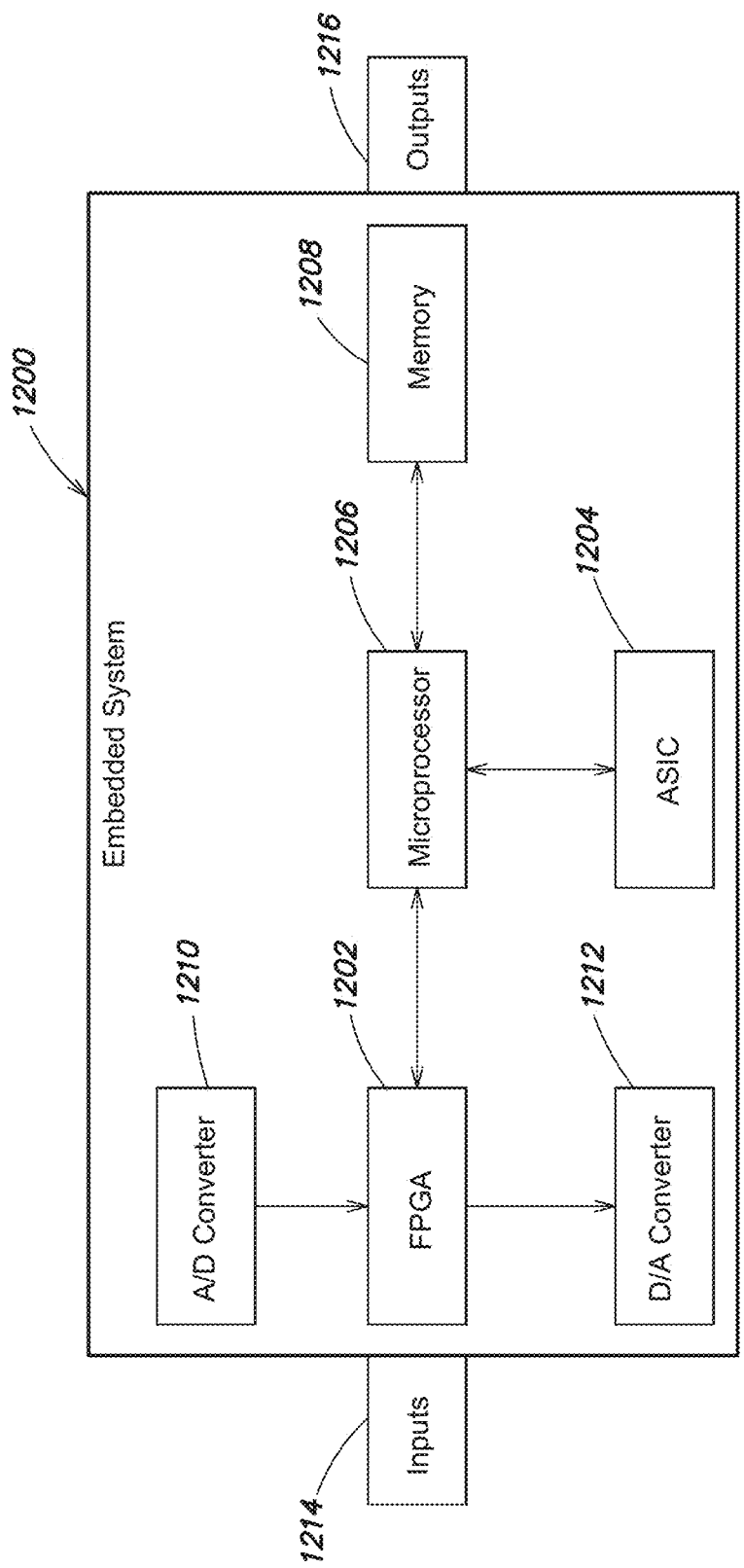
FIG. 12 is a schematic illustration of example target hardware in accordance with one or more embodiments.

FIG. 12 is a schematic illustration of an example embedded system 1200 in accordance with one or more embodiments. The embedded system 1200 may include one or more target hardware elements, such as a Field Programmable Gate Array (FPGA) 1202, an Application Specific Integrated Circuit (ASIC) 1204, and a microprocessor 1206, such as a Digital Signal Processor (DSP). The microprocessor 1206 may be connected to one or more memories, such as a memory 1208. The embedded system 1200 may also include one or more analog components, such as an Analog-to-Digital (A/D) converter 1210, and a Digital-to-Analog (D/A) converter 1212, which may be connected to the FPGA 1202. The embedded system 1200 also may include input and output ports or connectors indicated at 1214 and 1216.

The embedded system 1200 of FIG. 12 is intended for illustrative purposes only, and the present disclosure may be used with other embedded system designs. For example, the embedded system 1200 may include one or more general purpose processors, such as a Central Processing Unit (CPU) and/or one more Graphics Processing Units (GPUs) in addition to or in place of the microprocessor 1206. In addition, the embedded system 1200 may include additional components, fewer components, or different components than those shown in FIG. 12. Moreover, the embedded system 1200 may include components arranged in configurations that differ from the configuration of FIG. 12.

In some embodiments, code generated for the ADAS Controller model element 1116 (FIG. 11) may deployed on one or more target hardware elements of the embedded system 1200. For example, the user may partition the ADAS Controller model component 1116, and assign code generated for the different partitions to one or more of the FPGA 1202, the ASIC 1204, and the microprocessor 1206.

Exemplary Data Processing Device

Figure 13:
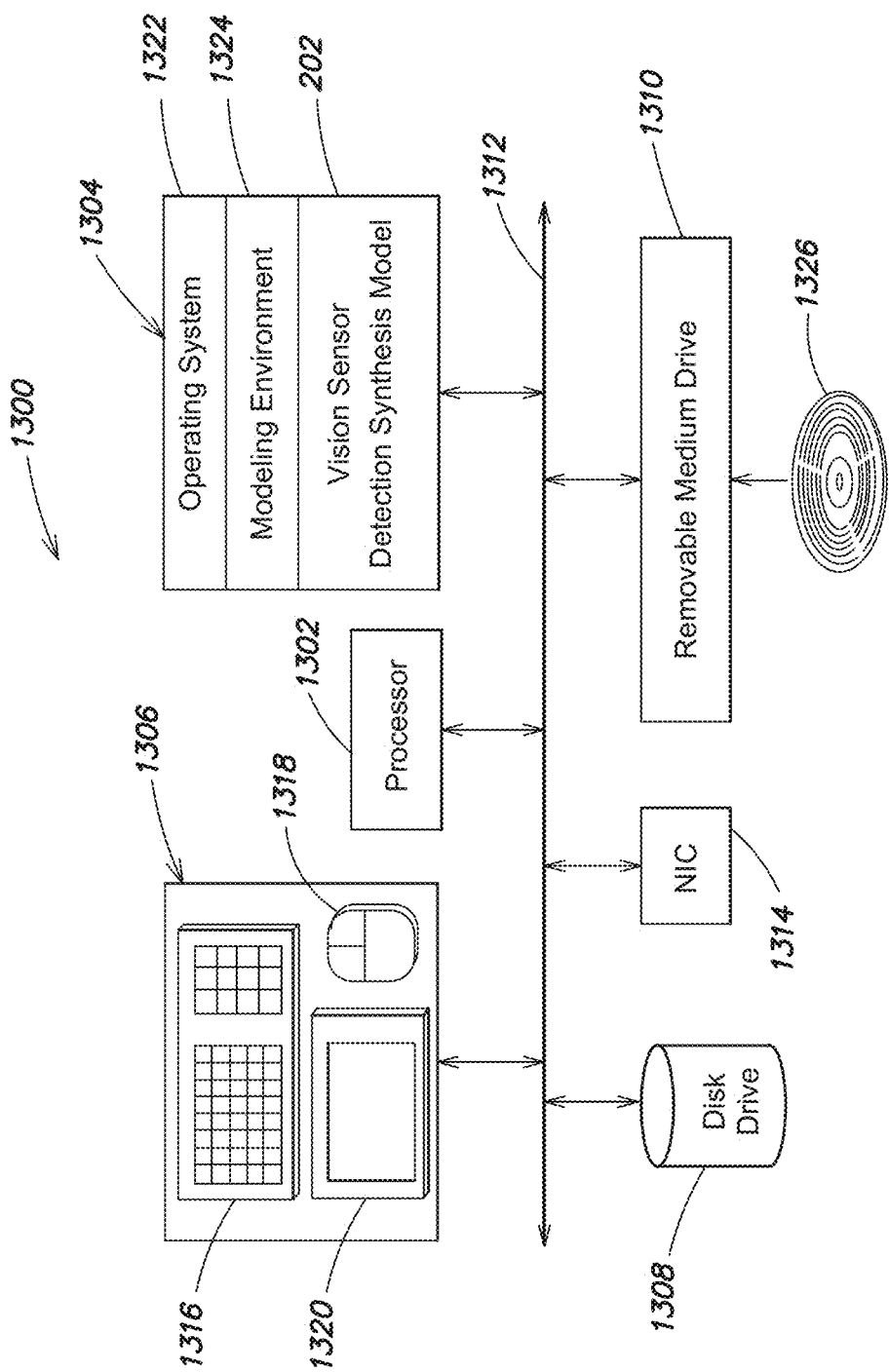
FIG. 13 is a schematic illustration of an example computer or data processing system for implementing one or more embodiments of the disclosure.

FIG. 13 is a schematic illustration of an example computer or data processing system 1300 for implementing one or more embodiments of the disclosure. The computer system 1300 may include one or more processing elements, such as a processor 1302, a main memory 1304, user input/output (I/O) 1306, a persistent data storage unit, such as a disk drive 1308, and a removable medium drive 1310 that are interconnected by a system bus 1312. The computer system 1300 may also include a communication unit, such as a network interface card (NIC) 1314. The user I/O 1306 may include a keyboard 1316, a pointing device, such as a mouse 1318, and a display 1320. Other user I/O 1306 components include voice or speech command systems, touchpads and touchscreens, printers, projectors, etc. Exemplary processors include single or multi-core Central Processing Units (CPUs), Graphics Processing Units (GPUs), Field Programmable Gate Arrays (FPGAs), Application Specific Integrated Circuits (ASICs), microprocessors, microcontrollers, etc.

The main memory 1304, which may be a Random Access Memory (RAM), may store a plurality of program libraries or modules, such as an operating system 1322, and one or more application programs that interface to the operating system 1322, such as a modeling environment 1324. The vision sensor detection synthesis model 202 also may be loaded in main memory 1304 and run.

The removable medium drive 1310 may accept and read a computer readable medium 1326, such as a CD, DVD, floppy disk, solid state drive, tape, flash memory or other non-transitory medium. The removable medium drive 1310 may also write to the computer readable medium 1326.

Suitable computer systems include personal computers (PCs), workstations, servers, laptops, tablets, palm computers, smart phones, electronic readers, and other portable computing devices, etc. Nonetheless, those skilled in the art will understand that the computer system 1300 of FIG. 13 is intended for illustrative purposes only, and that the present disclosure may be used with other computer, data processing, or computational systems or devices. The present disclosure may also be used in a computer network, e.g., client-server, architecture, or a public and/or private cloud computing arrangement. For example, the modeling environment 1300 may be hosted on one or more cloud servers or devices, and accessed by remote clients through a web portal or an application hosting system.

Suitable operating systems 1322 include the Windows series of operating systems from Microsoft Corp. of Redmond, Wash., the Android and Chrome OS operating systems from Google Inc. of Mountain View, Calif., the Linux operating system, the MAC OS® series of operating systems from Apple Inc. of Cupertino, Calif., and the UNIX® series of operating systems, among others. The operating system 1322 may provide services or functions for applications or modules, such as allocating memory, organizing data objects or files according to a file system, prioritizing requests, managing I/O, etc. The operating system 1322 may run on a virtual machine, which may be provided by the data processing system 1300.

As indicated above, a user, such as an engineer, scientist, programmer, developer, etc., may utilize one or more input devices, such as the keyboard 1316, the mouse 1318, and the display 1320 to operate the modeling environment 1324 and/or the vision sensor detection synthesis model 202.

Figure 14:
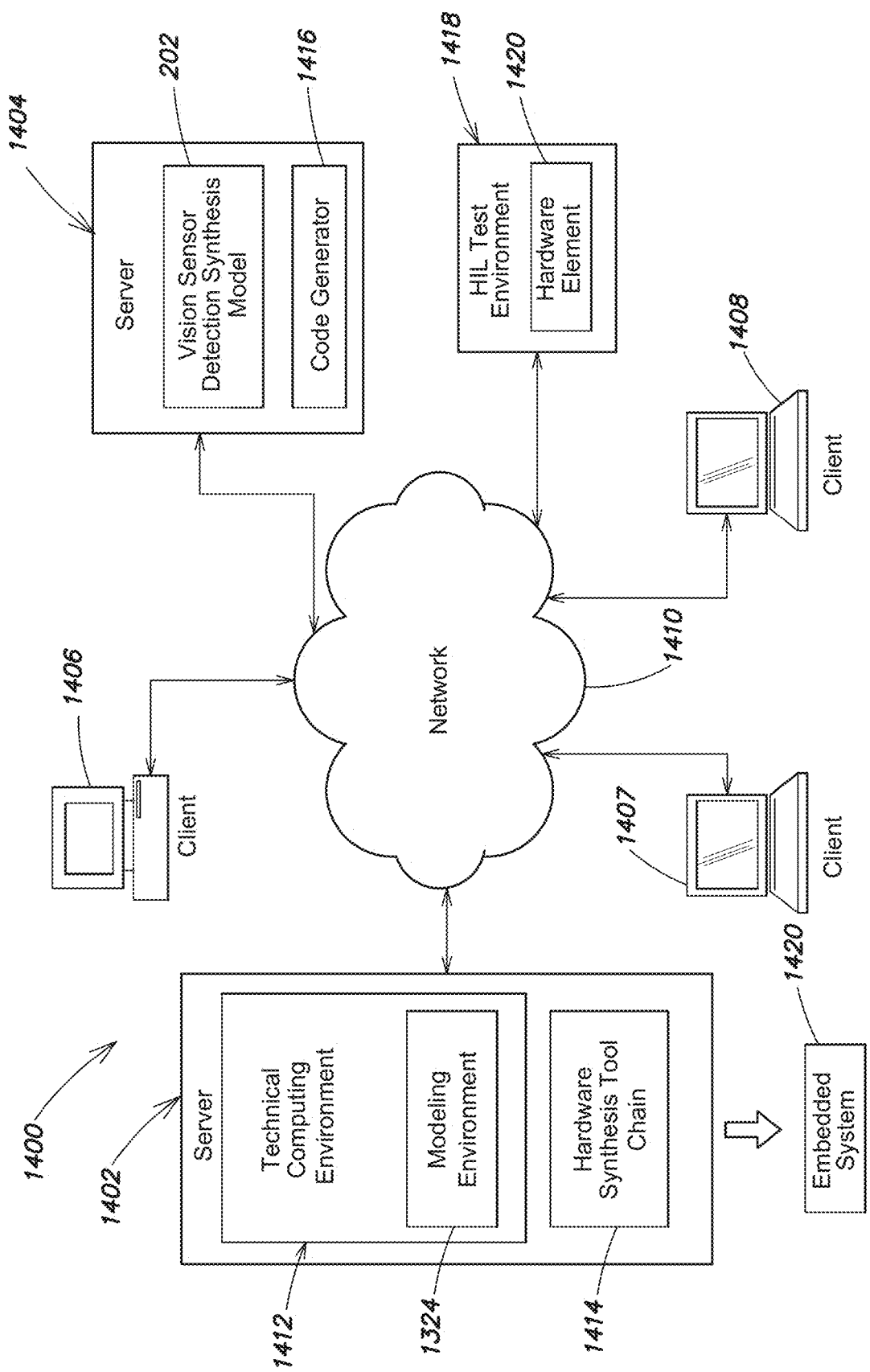
FIG. 14 is a schematic diagram of an example distributed computing environment in accordance with one or more embodiments.

FIG. 14 is a schematic diagram of an example distributed computing environment 1400 in which systems and/or methods described herein may be implemented. The environment 1400 may include client and server devices, such as two servers 1402 and 1404, and three clients 1406-1408, interconnected by one or more networks, such as network 1410. The servers 1402 and 1404 may include applications or processes accessible by the clients 1406-1408. For example, the server 1402 may run a technical computing environment 1412 and a hardware synthesis tool chain 1414. The technical computing environment 1412 may run the modeling environment 1324. The server 1404 may run the vision sensor detection synthesis model 202 and a code generator 1416, and/or some other application. The devices of the environment 1400 may interconnect via wired connections, wireless connections, or a combination of wired and wireless connections.

In some embodiments, the distributed environment 1400 may include a Hardware-in-the-Loop (HIL) test environment 1418, which may include one or more hardware elements indicated at 1420. The hardware synthesis tool chain 1414 may synthesize, e.g., fabricate, the hardware element 1420 and/or the embedded system 1200 utilizing code generated for the ADAS Controller model element 1116.

The servers 1402 and 1404 may include one or more devices capable of receiving, generating, storing, processing, executing, and/or providing information. For example, the servers 1402 and 1404 may include a computing device, such as a server, a desktop computer, a laptop computer, a tablet computer, a handheld computer, or a similar device.

The clients 1406-1408 may be capable of receiving, generating, storing, processing, executing, and/or providing information. Information may include any type of machine-readable information having substantially any format that may be adapted for use, e.g., in one or more networks and/or with one or more devices. The information may include digital information and/or analog information. The information may further be packetized and/or non-packetized. In an embodiment, the clients 1406-1408 may download data and/or code from the servers 1402 and 1404 via the network 1410. In some implementations, the clients 1406-1408 may be desktop computers, workstations, laptop computers, tablet computers, handheld computers, mobile phones (e.g., smart phones, radiotelephones, etc.), electronic readers, or similar devices. In some implementations, the clients 1406-1408 may receive information from and/or transmit information to the servers 1402 and 1404.

The network 1410 may include one or more wired and/or wireless networks. For example, the network 1410 may include a cellular network, a public land mobile network ("PLMN"), a local area network ("LAN"), a wide area network ("WAN"), a metropolitan area network ("MAN"), a telephone network (e.g., the Public Switched Telephone Network ("PSTN")), an ad hoc network, an intranet, the Internet, a fiber optic-based network, and/or a combination of these or other types of networks. Information may be exchanged between network devices using any network protocol, such as, but not limited to, the Internet Protocol (IP), Asynchronous Transfer Mode (ATM), Synchronous Optical Network (SONET), the User Datagram Protocol (UDP), Institute of Electrical and Electronics Engineers (IEEE) 802.11, etc.

The number of devices and/or networks shown in FIG. 14 is provided as an example. In practice, there may be additional devices and/or networks, fewer devices and/or networks, different devices and/or networks, or differently arranged devices and/or networks than those shown in FIG. 14. Furthermore, two or more devices shown in FIG. 14 may be implemented within a single device, or a single device shown in FIG. 14 may be implemented as multiple, distributed devices. Additionally, one or more of the devices of the distributed computing environment 1400 may perform one or more functions described as being performed by another one or more devices of the environment 1400.

The foregoing description of embodiments is intended to provide illustration and description, but is not intended to be exhaustive or to limit the disclosure to the precise form disclosed. Modifications and variations are possible in light of the above teachings or may be acquired from a practice of the disclosure. For example, while a series of acts has been described above with respect to the flow diagrams, the order of the acts may be modified in other implementations. In addition, the acts, operations, and steps may be performed by additional or other modules or entities, which may be combined or separated to form other modules or entities. Further, non-dependent acts may be performed in parallel. Also, the term "user", as used herein, is intended to be broadly interpreted to include, for example, a computer or data processing system or a human user of a computer or data processing system, unless otherwise stated.

Further, certain embodiments of the disclosure may be implemented as logic that performs one or more functions. This logic may be hardware-based, software-based, or a combination of hardware-based and software-based. Some or all of the logic may be stored in one or more tangible non-transitory computer-readable storage media and may include computer-executable instructions that may be executed by a computer or data processing system. The computer-executable instructions may include instructions that implement one or more embodiments of the disclosure. The tangible non-transitory computer-readable storage media may be volatile or non-volatile and may include, for example, flash memories, dynamic memories, removable disks, and non-removable disks.

No element, act, or instruction used herein should be construed as critical or essential to the disclosure unless explicitly described as such. Also, as used herein, the article "a" is intended to include one or more items. Where only one item is intended, the term "one" or similar language is used.

Further, the phrase "based on" is intended to mean "based, at least in part, on" unless explicitly stated otherwise.

The foregoing description has been directed to specific embodiments of the present disclosure. It will be apparent, however, that other variations and modifications may be made to the described embodiments, with the attainment of some or all of their advantages. Therefore, it is the object of the appended claims to cover all such variations and modifications as come within the true spirit and scope of the disclosure.

What is claimed is:

1. A method comprising:
   for electronic data of a virtual scene representing a physical scene, the electronic data including a first three-dimensional (3D) coordinate frame and locations of 3D geometric shapes within the virtual scene relative to the first 3D coordinate frame, the 3D geometric shapes representing physical objects,
   identifying a set of the 3D geometric shapes that are within a field of view of a model of a vision sensor included in the virtual scene;
   utilizing, by a processor, an object detection algorithm to determine which ones of the set of the 3D geometric shapes are detected by the model of the vision sensor, the object detection algorithm including one or more adjustable parameters;
   determining, by the processor, measured positions for the ones of the set of the 3D geometric shapes detected by the model of the vision sensor, where the measured positions are relative to an image plane derived for the model of the vision sensor;
   transforming, by the processor, the measured positions for the ones of the set of the 3D geometric shapes detected by the model of the vision sensor from the image plane to positions in the virtual scene relative to the first 3D coordinate frame or a second 3D coordinate frame; and
   outputting the positions of the ones of the set of the 3D geometric shapes detected by the model of the vision sensor.

2. The method of claim 1 wherein the electronic data further includes a speed for a given 3D geometric shape, the method further comprising:
   determining, by the processor, a measured velocity of the given 3D geometric shape relative to the image plane;
   transforming, by the processor, the measured velocity of the given 3D geometric shape in the image plane to a velocity in the virtual scene relative to the first 3D coordinate frame or the second 3D coordinate frame; and
   outputting the velocity of the given 3D shape relative to the first 3D coordinate frame or the second 3D coordinate frame.

3. The method of claim 1 further comprising:
   adding, by the processor, a measurement noise to the positions of the ones of the set of the 3D geometric shapes detected by the model of the vision sensor.

4. The method of claim 3 wherein the adding includes:
   performing a spatial correlation of a noise distribution from coordinates in the image plane to coordinates in the first 3D coordinate frame or the second 3D coordinate frame.

5. The method of claim 4 wherein the noise distribution is a Gaussian distribution.

6. The method of claim 1 wherein the utilizing the object detection algorithm includes:

defining bounding boxes around the set of the 3D geometric shapes that are within the field of view of the model of the vision sensor; and
determining which ones of the bounding boxes have sizes relative to the image plane that are greater than or equal to or that are greater than a first of the one or more adjustable parameters.

7. The method of claim 6 wherein the bounding boxes are two dimensional (2D) polygons.

8. The method of claim 1 wherein the utilizing the object detection algorithm includes:
defining bounding boxes around the set of the 3D geometric shapes that are within the field of view of the model of the vision sensor, where a first bounding box partially occludes a second bounding box so as to define a non-occluded portion of the second bounding box;
determining whether the non-occluded portion of the second bounding box has a size relative to the image plane that is greater than or equal to or that is greater than a first of the one or more adjustable parameters.

9. The method of claim 1 further comprising:
generating object classifications for the ones of the set of the 3D geometric shapes detected by the model of the vision sensor; and
outputting the object classifications for the ones of the set of the 3D geometric shapes detected by the model of the vision sensor.

10. The method of claim 1 wherein the 3D geometric shapes are cuboids and the physical objects represented by the cuboids include vehicles.

11. The method of claim 1 wherein one or more extrinsic parameters of the model of the vision sensor are adjustable and include a location and an orientation of the vision sensor in the first 3D coordinate frame or the second 3D coordinate frame.

12. The method of claim 1 wherein one or more intrinsic parameters of the model of the vision sensor are adjustable and include at least one of:
a focal length;
a principal point;
an image size;
a radial distortion;
a tangential distortion; or
a skew coefficient.

13. The method of claim 1 wherein the one or more adjustable parameters of the object detection algorithm include at least one of:
a maximum range at which the physical objects can be detected;
a minimum size for detection of the 3D geometric shapes; or
a probability of detecting a given 3D geometric shape.

14. The method of claim 1 further comprising:
generating one or more false positive object detections;
generating a position for the one or more false positive object detections; and
outputting the position for the one or more false positive object detections.

15. The method of claim 1 wherein the field of view is derived as a function of one or more extrinsic parameters of the model of the vision sensor and one or more intrinsic parameters of the model of the vision sensor.

16. The method of claim 9 wherein the generating includes applying a confusion matrix to true classifications assigned to the ones of the set of the 3D geometric shapes detected by the model of the vision sensor to generate object classifications.

17. The method of claim 1 wherein the first 3D coordinate frame is a world or scenario coordinate frame, and the second 3D coordinate frame is an ego vehicle coordinate frame.

18. One or more non-transitory computer-readable media, having stored thereon instructions that when executed by a computing device, cause the computing device to perform operations comprising:
for electronic data of a virtual scene representing a physical scene, the electronic data including a first three-dimensional (3D) coordinate frame and locations of 3D geometric shapes within the virtual scene relative to the first 3D coordinate frame, the 3D geometric shapes representing physical objects,
identifying a set of the 3D geometric shapes that are within a field of view of a model of a vision sensor included in the virtual scene;
utilizing an object detection algorithm to determine which ones of the set of the 3D geometric shapes are detected by the model of the vision sensor, the object detection algorithm including one or more adjustable parameters;
determining measured positions for the ones of the set of the 3D geometric shapes detected by the model of the vision sensor, where the measured positions are relative to an image plane derived for the model of the vision sensor;
transforming the measured positions for the ones of the set of the 3D geometric shapes detected by the model of the vision sensor from the image plane to positions in the virtual scene relative to the first 3D coordinate frame or a second 3D coordinate frame; and
outputting the positions of the ones of the set of the 3D geometric shapes detected by the model of the vision sensor.

19. The one or more non-transitory computer-readable media of claim 18 wherein the operations further comprise:
adding a measurement noise to the positions of the ones of the set of the 3D geometric shapes detected by the model of the vision sensor.

20. The one or more non-transitory computer-readable media of claim 19 wherein the adding includes:
performing a spatial correlation of a noise distribution from coordinates in the image plane to coordinates in the first 3D coordinate frame or the second 3D coordinate frame.

21. The one or more non-transitory computer-readable media of claim 18 wherein the electronic data further includes a speed for a given 3D geometric shape, the operations further comprise:
determining a measured velocity of the given 3D geometric shape relative to the image plane;
transforming the measured velocity of the given 3D geometric shape in the image plane to a velocity in the virtual scene relative to the first 3D coordinate frame or the second 3D coordinate frame; and
outputting the velocity of the given 3D shape relative to the first 3D coordinate frame or the second 3D coordinate frame.

22. The one or more non-transitory computer-readable media of claim 18 wherein the utilizing the object detection algorithm includes:
defining bounding boxes around the set of the 3D geometric shapes that are within the field of view of the model of the vision sensor; and determining which ones of the bounding boxes have sizes relative to the image plane that are greater than or equal to or that are greater than a first of the one or more adjustable parameters.

23. The one or more non-transitory computer-readable media of claim 22 wherein the bounding boxes are two dimensional (2D) polygons.

24. The one or more non-transitory computer-readable media of claim 18 wherein the utilizing the object detection algorithm includes:
defining bounding boxes around the set of the 3D geometric shapes that are within the field of view of the model of the vision sensor, where a first bounding box partially occludes a second bounding box so as to define a non-occluded portion of the second bounding box;
determining whether the non-occluded portion of the second bounding box has a size relative to the image plane that is greater than or equal to or that is greater than a first of the one or more adjustable parameters.

25. The one or more non-transitory computer-readable media of claim 18 wherein the operations further comprise:
generating object classifications for the ones of the set of the 3D geometric shapes detected by the model of the vision sensor; and
outputting the object classifications for the ones of the set of the 3D geometric shapes detected by the model of the vision sensor.

26. The one or more non-transitory computer-readable media of claim 25 wherein the generating includes applying a confusion matrix to true classifications assigned to the ones of the set of the 3D geometric shapes detected by the model of the vision sensor to generate object classifications.

27. The one or more non-transitory computer-readable media of claim 18 wherein the 3D geometric shapes are cuboids and the physical objects represented by the cuboids include vehicles.

28. The one or more non-transitory computer-readable media of claim 18 wherein one or more extrinsic parameters of the model of the vision sensor are adjustable and include a location and an orientation of the vision sensor in the first 3D coordinate frame or the second 3D coordinate frame.

29. The one or more non-transitory computer-readable media of claim 18 wherein one or more intrinsic parameters of the model of the vision sensor are adjustable and include at least one of:
a focal length;
a principal point;
an image size;
a radial distortion;
a tangential distortion; or
a skew coefficient.

30. The one or more non-transitory computer-readable media of claim 18 wherein the one or more adjustable parameters of the object detection algorithm include at least one of:
a maximum range at which the physical objects can be detected;
a minimum size for detection of the 3D geometric shapes; or
a probability of detecting a given 3D geometric shape.

31. The one or more non-transitory computer-readable media of claim 18 wherein the operations further comprise:
generating one or more false positive object detections;
generating a position for the one or more false positive object detections; and
outputting the position for the one or more false positive object detections.

32. The one or more non-transitory computer-readable media of claim 18 wherein the field of view is derived as a function of one or more extrinsic parameters of the model of the vision sensor and one or more intrinsic parameters of the model of the vision sensor.

33. The one or more non-transitory computer-readable media of claim 18 wherein the first 3D coordinate frame is a world or scenario coordinate frame, and the second 3D coordinate frame is an ego vehicle coordinate frame.

34. An apparatus comprising:
one or more electronic memories configured to store electronic data of a virtual scene representing a physical scene, the electronic data including a first three-dimensional (3D) coordinate frame and locations of 3D geometric shapes within the virtual scene relative to the first 3D coordinate frame, the 3D geometric shapes representing physical objects; and
one or more processors coupled to the one or more electronic memories, the one or more processors configured to:
identify a set of the 3D geometric shapes that are within a field of view of a model of a vision sensor included in the virtual scene;
utilize an object detection algorithm to determine which ones of the set of the 3D geometric shapes are detected by the model of the vision sensor, the object detection algorithm including one or more adjustable parameters;
determine measured positions for the ones of the set of the 3D geometric shapes detected by the model of the vision sensor, where the measured positions are relative to an image plane derived for the model of the vision sensor;
transform the measured positions for the ones of the set of the 3D geometric shapes detected by the model of the vision sensor from the image plane to positions in the virtual scene relative to the first 3D coordinate frame or a second 3D coordinate frame; and
output the positions of the ones of the set of the 3D geometric shapes detected by the model of the vision sensor.

35. The apparatus of claim 34 wherein the electronic data further includes a speed for a given 3D geometric shape, the one or more processors further configured to:
determine a measured velocity of the given 3D geometric shape relative to the image plane;
transform the measured velocity of the given 3D geometric shape in the image plane to a velocity in the virtual scene relative to the first 3D coordinate frame or the second 3D coordinate frame; and
output the velocity of the given 3D shape relative to the first 3D coordinate frame or the second 3D coordinate frame.

36. The apparatus of claim 34 wherein the one or more processors is further configured to:
add a measurement noise to the positions of the ones of the set of the 3D geometric shapes detected by the model of the vision sensor.

37. The apparatus of claim 36 wherein the add the measurement noise includes:
performing a spatial correlation of a noise distribution from coordinates in the image plane to coordinates in the first 3D coordinate frame or the second 3D coordinate frame.

38. The apparatus of claim 20 wherein the utilizing the object detection algorithm includes:
defining bounding boxes around the set of the 3D geometric shapes that are within the field of view of the model of the vision sensor; and
determining which ones of the bounding boxes have sizes relative to the image plane that are greater than or equal to or that are greater than a first of the one or more adjustable parameters.

39. The apparatus of claim 38 wherein the bounding boxes are two dimensional (2D) polygons.

40. The apparatus of claim 20 wherein the utilizing the object detection algorithm includes:
defining bounding boxes around the set of the 3D geometric shapes that are within the field of view of the model of the vision sensor, where a first bounding box partially occludes a second bounding box so as to define a non-occluded portion of the second bounding box;
determining whether the non-occluded portion of the second bounding box has a size relative to the image plane that is greater than or equal to or that is greater than a first of the one or more adjustable parameters.

41. The apparatus of claim 20 wherein the one or more processors are further configured to:
generate object classifications for the ones of the set of the 3D geometric shapes detected by the model of the vision sensor; and
output the object classifications for the ones of the set of the 3D geometric shapes detected by the model of the vision sensor.

42. The apparatus of claim 41 wherein the generate object classifications includes applying a confusion matrix to true classifications assigned to the ones of the set of the 3D geometric shapes detected by the model of the vision sensor to generate object classifications.

43. The apparatus of claim 34 wherein the 3D geometric shapes are cuboids and the physical objects represented by the cuboids include vehicles.

44. The apparatus of claim 34 wherein one or more extrinsic parameters of the model of the vision sensor are adjustable and include a location and an orientation of the vision sensor in the first 3D coordinate frame or the second 3D coordinate frame.

45. The apparatus of claim 34 wherein one or more intrinsic parameters of the model of the vision sensor are adjustable and include at least one of:
a focal length;
a principal point;
an image size;
a radial distortion;
a tangential distortion; or
a skew coefficient.

46. The apparatus of claim 34 wherein the one or more adjustable parameters of the object detection algorithm include at least one of:
a maximum range at which the physical objects can be detected;
a minimum size for detection of the 3D geometric shapes; or
a probability of detecting a given 3D geometric shape.

47. The apparatus of claim 34 wherein the one or more processors are further configured to:
generate one or more false positive object detections;
generate a position for the one or more false positive object detections; and
output the position for the one or more false positive object detections.

48. The apparatus of claim 34 wherein the field of view is derived as a function of one or more extrinsic parameters of the model of the vision sensor and one or more intrinsic parameters of the model of the vision sensor.

49. The apparatus of claim 34 wherein the first 3D coordinate frame is a world or scenario coordinate frame, and the second 3D coordinate frame is an ego vehicle coordinate frame.

* * * * *

UNITED STATES PATENT AND TRADEMARK OFFICE
CERTIFICATE OF CORRECTION

PATENT NO. : 10,635,844 B1  
APPLICATION NO. : 15/906722  
DATED : April 28, 2020  
INVENTOR(S) : Trevor Roose et al.

Page 1 of 1

It is certified that error appears in the above-identified patent and that said Letters Patent is hereby corrected as shown below:

In the Specification

Column 7, Lines 31-32 read:  
"embodiments, this point may correspond to middle of a car's vehicle's rear axle. The scene data 204 may also include"  
Should read:  
--embodiments, this point may correspond to middle of a vehicle's rear axle. The scene data 204 may also include--

Column 10, Line 32 reads:  
"frame 512 may be defined with an is origin 514 at the upper"  
Should read:  
--frame 512 may be defined with an origin 514 at the upper--

Column 14, Line 57 reads:  
"$T = [Y_o\ x_o\ z_o]R_1$"  
Should read:  
--$T = [y_o\ x_o\ z_o]R_1$--

Column 22, Line 57 reads:  
"ponents 1112-1116 named 'Scenario Reader', "Vision""  
Should read:  
--ponents 1112-1116 named 'Scenario Reader', 'Vision--

Signed and Sealed this  
Sixth Day of July, 2021

Drew Hirshfeld  
*Performing the Functions and Duties of the*  
*Under Secretary of Commerce for Intellectual Property and*  
*Director of the United States Patent and Trademark Office*